(12) United States Patent
Morii

(10) Patent No.: US 8,240,205 B2
(45) Date of Patent: Aug. 14, 2012

(54) MECHANICAL QUANTITY SENSOR AND METHOD OF MANUFACTURING THE SAME

(75) Inventor: Akio Morii, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 134 days.

(21) Appl. No.: 12/527,554

(22) PCT Filed: Jun. 24, 2008

(86) PCT No.: PCT/JP2008/061444
§ 371 (c)(1),
(2), (4) Date: Aug. 17, 2009

(87) PCT Pub. No.: WO2009/001815
PCT Pub. Date: Dec. 31, 2008

(65) Prior Publication Data
US 2010/0089156 A1    Apr. 15, 2010

(30) Foreign Application Priority Data

Jun. 26, 2007  (JP) ................................ P2007-167833

(51) Int. Cl.
*G01C 19/00* (2006.01)
(52) U.S. Cl. .............................. 73/504.12; 257/E21.002
(58) Field of Classification Search ............... 73/504.12, 73/510, 514.01, 514.29; 438/50; 257/E21.211
See application file for complete search history.

(56) References Cited

U.S. PATENT DOCUMENTS

| | | | | |
|---|---|---|---|---|
| 5,233,213 A | * | 8/1993 | Marek ........................... | 257/415 |
| 6,400,009 B1 | * | 6/2002 | Bishop et al. .................. | 257/704 |
| 6,450,031 B1 | * | 9/2002 | Sakai et al. ................ | 73/514.16 |
| 6,973,829 B2 | * | 12/2005 | Sakai et al. ................ | 73/514.32 |

(Continued)

FOREIGN PATENT DOCUMENTS

JP    10-270719    10/1998

(Continued)

OTHER PUBLICATIONS

International Search Report from the Japanese Patent Office for International Application No. PCT/JP2008/061444 (Aug. 19, 2008).

(Continued)

*Primary Examiner* — Peter MacChiarolo
*Assistant Examiner* — Samir M Shah
(74) *Attorney, Agent, or Firm* — Finnegan, Henderson, Farabow, Garrett & Dunner, L.L.P.

(57) ABSTRACT

A mechanical quantity sensor includes a first structure having a fixed portion with an opening, a displaceable portion arranged in the opening and displaceable relative to the fixed portion, and a connection portion connecting the fixed portion and the displaceable portion, a second structure having a weight portion joined to the displaceable portion and a pedestal joined to the fixed portion, and arranged and stacked on the first structure, and a base having a driving electrode and a detection electrode arranged on a face facing the weight portion, connected to the pedestal, and arranged and stacked on the second structure. The second structure has a projection arranged in an area on a face of the weight portion facing the base, the area corresponding to an area where the driving electrode and the detection electrode are not arranged, the projection having a thickness larger than thicknesses of the driving electrode and the detection electrode.

6 Claims, 15 Drawing Sheets

U.S. PATENT DOCUMENTS

| | | | |
|---|---|---|---|
| 7,132,722 B2* | 11/2006 | Ohashi | 257/415 |
| 7,178,400 B2* | 2/2007 | Murata et al. | 73/514.29 |
| 7,337,670 B2* | 3/2008 | Murata et al. | 73/514.16 |
| 7,394,138 B2* | 7/2008 | Katou et al. | 257/414 |
| 7,838,951 B2* | 11/2010 | Kimino | 257/414 |
| 2004/0079154 A1 | 4/2004 | Yoshikawa et al. | |
| 2004/0182165 A1* | 9/2004 | Miyashita | 73/718 |
| 2005/0000285 A1* | 1/2005 | Nishida et al. | 73/504.12 |
| 2005/0056096 A1 | 3/2005 | Ozawa et al. | |
| 2005/0194651 A1* | 9/2005 | Ohashi | 257/415 |
| 2005/0194652 A1 | 9/2005 | Dutoit et al. | |
| 2005/0229704 A1* | 10/2005 | Murata et al. | 73/514.16 |
| 2005/0253283 A1* | 11/2005 | DCamp et al. | 257/787 |
| 2006/0266862 A1* | 11/2006 | Hashimoto et al. | 242/343.2 |
| 2007/0120205 A1* | 5/2007 | Murata et al. | 257/414 |
| 2010/0077859 A1* | 4/2010 | Takeshita et al. | 73/504.12 |
| 2010/0089156 A1* | 4/2010 | Morii | 73/504.12 |
| 2010/0139400 A1* | 6/2010 | Morii | 73/504.12 |

FOREIGN PATENT DOCUMENTS

| | | |
|---|---|---|
| JP | 2002-350138 | 12/2002 |
| JP | 2004-245753 | 9/2004 |
| JP | 2005-127745 | 5/2005 |
| JP | 2005-249454 | 9/2005 |
| JP | 2005-265565 | 9/2005 |
| JP | 2007-047069 | 2/2007 |
| JP | 2007-057469 | 3/2007 |
| JP | 2006-226770 | 8/2008 |

OTHER PUBLICATIONS

International Preliminary Report on Patentability and Written Opinion issued by the International Bureau of WIPO on Jan. 21, 2010, for International Application No. PCT/JP2008/061444.

Extended European Search Report, issued by European Patent Office, mailed Sep. 28, 2011, in European Patent Application No. 08777536.7 (7 pages).

* cited by examiner

MECHANICAL QUANTITY SENSOR AND METHOD OF MANUFACTURING THE SAME

TECHNICAL FIELD

The present invention relates to a mechanical quantity sensor detecting a mechanical quantity and a method of manufacturing the same.

BACKGROUND ART

There has been disclosed a technique of an angular velocity sensor, which is structured such that a transducer structure formed of a semiconductor is sandwiched by a pair of glass substrates and joined thereto, for detecting an angular velocity (see Reference 1).
Reference 1: JP-A 2002-350138 (KOKAI)

DISCLOSURE OF THE INVENTION

However, it has been found that when a glass substrate is anodically bonded to the side of the transducer structure where a movable weight (weight portion) is arranged, it is possible that the weight is attracted to the glass substrate by electrostatic attraction and adheres thereto, and it no longer functions as an angular velocity sensor. Considering this situation, an object of the present invention is to provide a mechanical quantity sensor and a method of manufacturing the same, capable of preventing adhesion of the weight (weight portion) to the glass substrate when the transducer structure formed of a semiconductor and the glass substrate are anodically bonded.

A mechanical quantity sensor according to an aspect of the present invention includes: a first structure having a fixed portion with an opening, a displaceable portion arranged in the opening and displaceable relative to the fixed portion, and a connection portion connecting the fixed portion and the displaceable portion, the first structure being formed of a first semiconductor material in a plate shape; a second structure having a weight portion joined to the displaceable portion and a pedestal arranged surrounding the weight portion and joined to the fixed portion, the second structure being formed of a second semiconductor material and arranged and stacked on the first structure; a first base connected to the fixed portion, arranged and stacked on the first structure, and formed of an insulating material; and a second base having a driving electrode applying vibration in a stacking direction to the displaceable portion, arranged on a face facing the weight portion, and formed of a conductive material, and a detection electrode detecting a displacement of the displaceable portion, arranged on a face facing the weight portion, and formed of a conductive material, the second base formed of an insulating material, connected to the pedestal, and arranged and stacked on the second structure, in which the second structure has a projection arranged in an area on a face of the weight portion facing the second base, the area corresponding to an area where the driving electrode and the detection electrode are not arranged, the projection having a thickness larger than thicknesses of the driving electrode and the detection electrode.

A method of manufacturing a mechanical quantity sensor according to an aspect of the present invention includes: forming a first structure having a fixed portion with an opening, a displaceable portion arranged in the opening and displaceable relative to the fixed portion, and a connection portion connecting the fixed portion and the displaceable portion, by etching a first layer of a semiconductor substrate formed by sequentially stacking the first layer formed of a first semiconductor material, a second layer formed of an insulating material, and a third layer formed of a second semiconductor material; arranging and stacking a first base formed of an insulating material on the first structure by joining the first base to the fixed portion; forming a second structure having a weight portion joined to the displaceable portion, a projection arranged on a face of the weight portion on a side opposite to a face joined to the displaceable portion or on a face of an area of the third layer where the weight portion is to be formed on a side opposite to a face joined to the displaceable portion, and a pedestal arranged surrounding the weight portion and joined to the fixed portion, by etching the third layer; and arranging and stacking a second base on the second structure by anodically bonding the second base to the pedestal, the second base formed of an insulating material and having a first driving electrode arranged on a face facing the weight portion, formed of a conductive material, and applying vibration in a stacking direction to the displaceable portion, and a first detection electrode arranged on a face facing the weight portion, formed of a conductive material, and detecting a displacement of the displaceable portion, in which the projection is arranged in an area corresponding to an area where the first driving electrode and the first detection electrode are not arranged, and has a thickness larger than thicknesses of the first driving electrode and the first detection electrode.

EXPLANATION OF CODES 100, 200 . . . mechanical quantity sensor; 110 . . . first structure; 111 . . . fixed portion; 111*a* . . . frame portion; 111*b*, 111*c* . . . projecting portion; 112 (112*a*-112*e*) . . . displaceable portion; 113 (113*a*-113*d*) . . . connection portion; 114 (114*a*-114*j*) . . . block upper layer portion; 115 (115*a*-115*d*) . . . opening; 120, 121, 122, 123 . . . joining part; 130 . . . second structure; 131 . . . pedestal; 131*a* . . . frame portion; 131*b*-131*d* . . . projecting portion; 132 (132*a*-133*e*) . . . weight portion; 133 . . . opening; 134 (134*a*-134*j*) . . . block lower layer portion; 135 . . . pocket; 140, 240 . . . first base; 141 . . . frame portion; 142 . . . bottom plate portion; 143 . . . recessed portion; 144*a* . . . driving electrode; 144*b*-144*e* . . . detection electrode; 150, 250 . . . second base; 154*a* . . . driving electrode; 154*b*-154*e* . . . detection electrode; 160-162, 262 . . . conduction portion; 170, 170*a* . . . projection; 180 . . . space-charge layer; 10 . . . gap; 11 . . . weight-shaped through hole; L1, L2, L4-L11 . . . wiring layer; T1-T11 . . . wiring terminal; E1 . . . driving electrode, detection electrode

BEST MODE FOR CARRYING OUT THE INVENTION

Hereinafter, embodiments of the present invention will be described in detail with reference to the drawings.

First Embodiment

Figure 1:
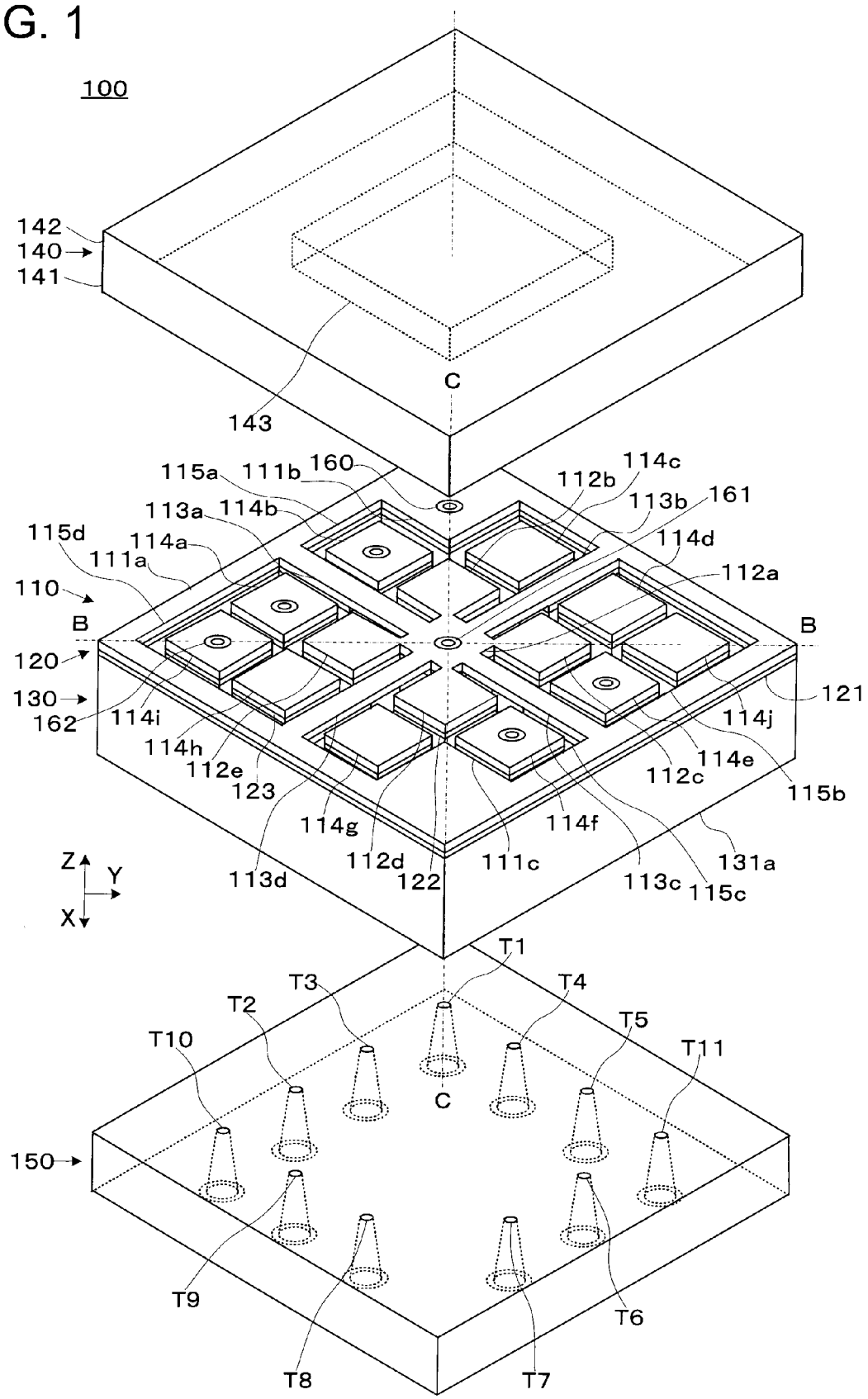
FIG. 1 is an exploded perspective view showing a state that a mechanical quantity sensor according to a first embodiment of the present invention is disassembled.

FIG. 1 is an exploded perspective view showing a state that a mechanical quantity sensor 100 is disassembled. The mechanical quantity sensor 100 has a first structure 110, a joining part 120, and a second structure 130 which are stacked one another, and a first base 140 and a second base 150.

Figure 2:
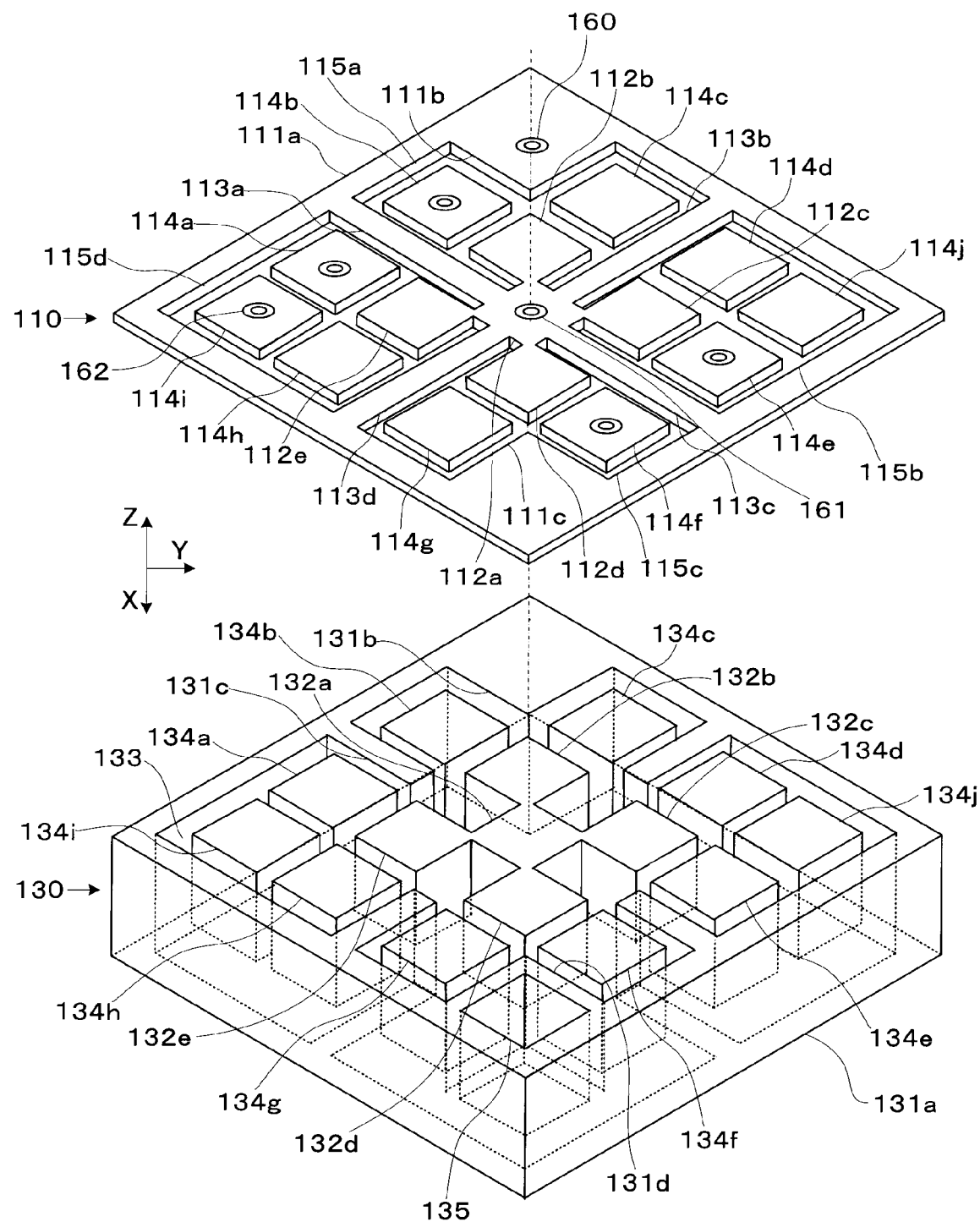
FIG. 2 is an exploded perspective view showing a state that the mechanical quantity sensor in FIG. 1 is disassembled.
Figure 3:
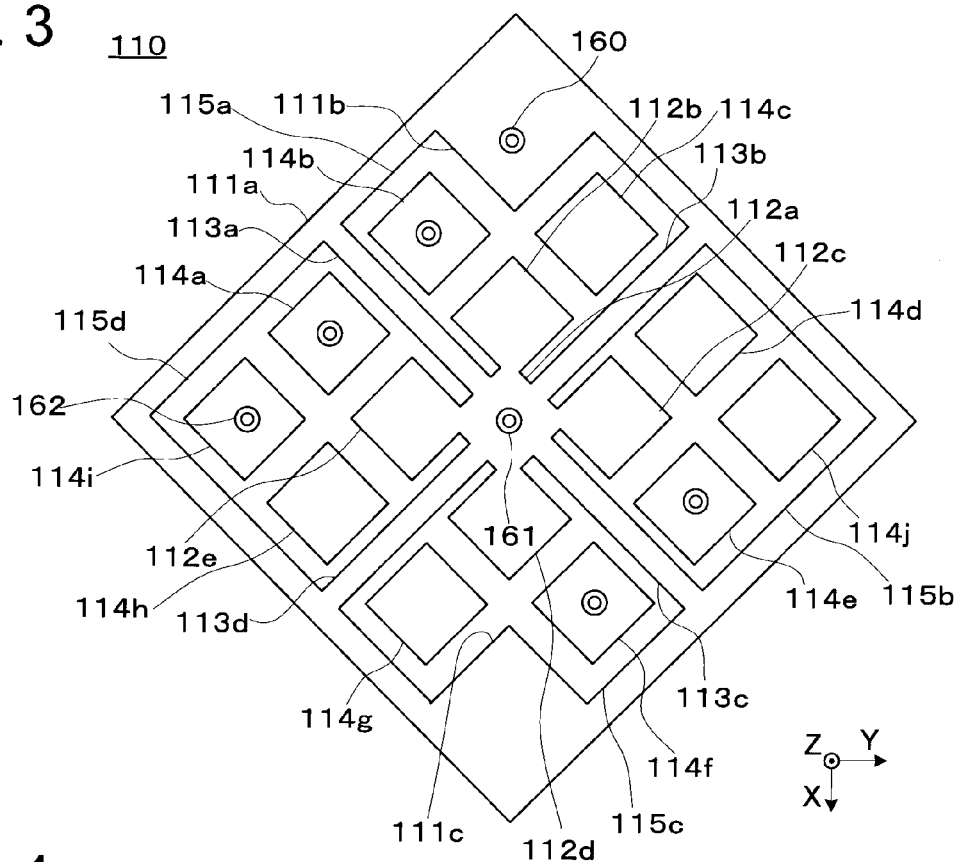
FIG. 3 is a top view of a first structure.
Figure 4:
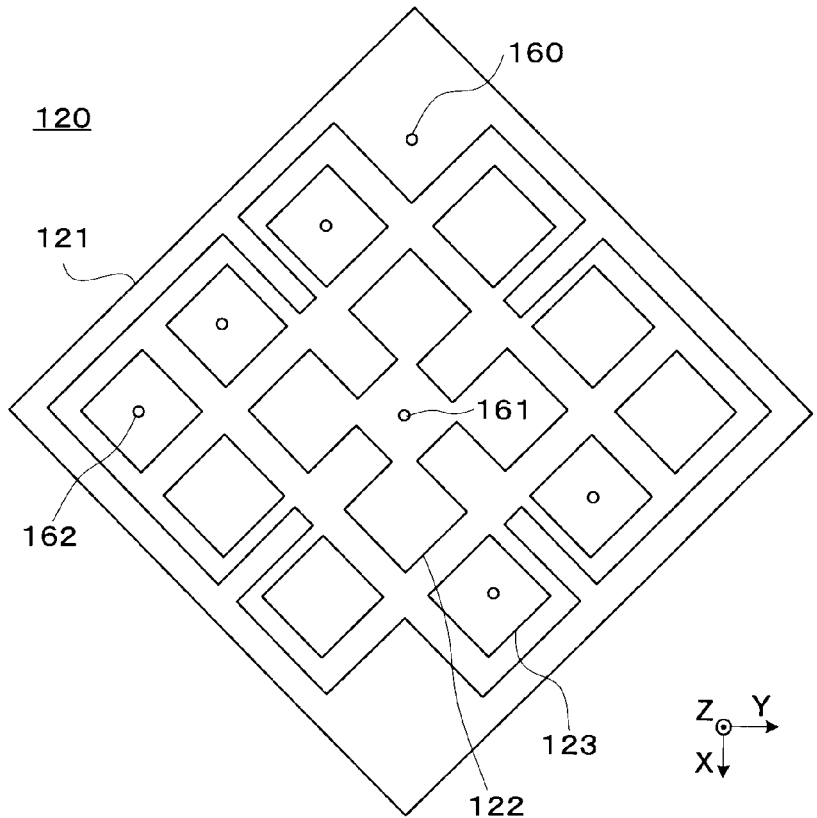
FIG. 4 is a top view of a joining part.
Figure 5:
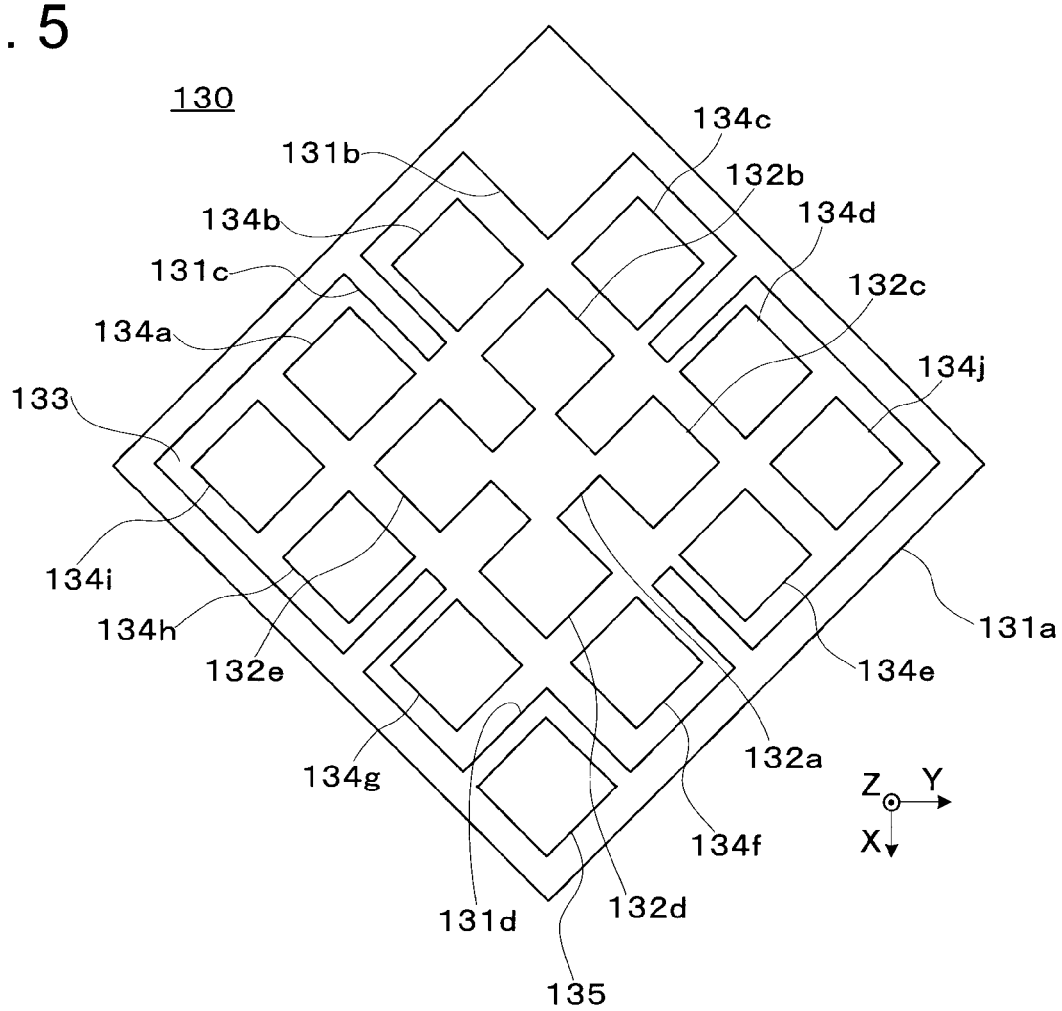
FIG. 5 is a top view of a second structure.
Figure 7:
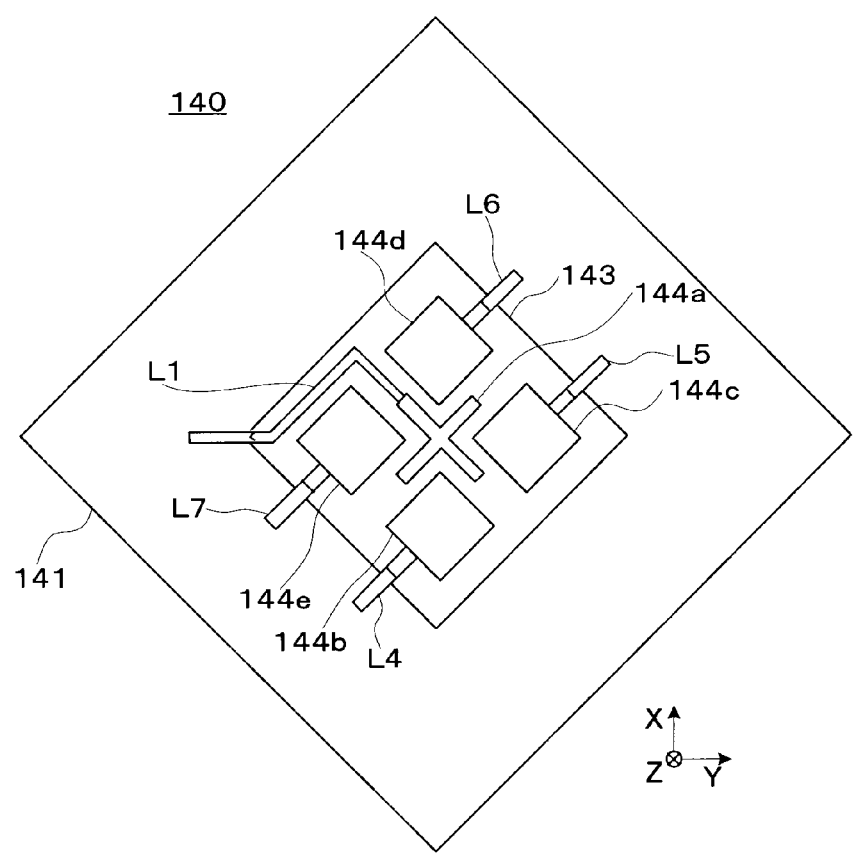
FIG. 7 is a bottom view of a first base.
Figure 8:
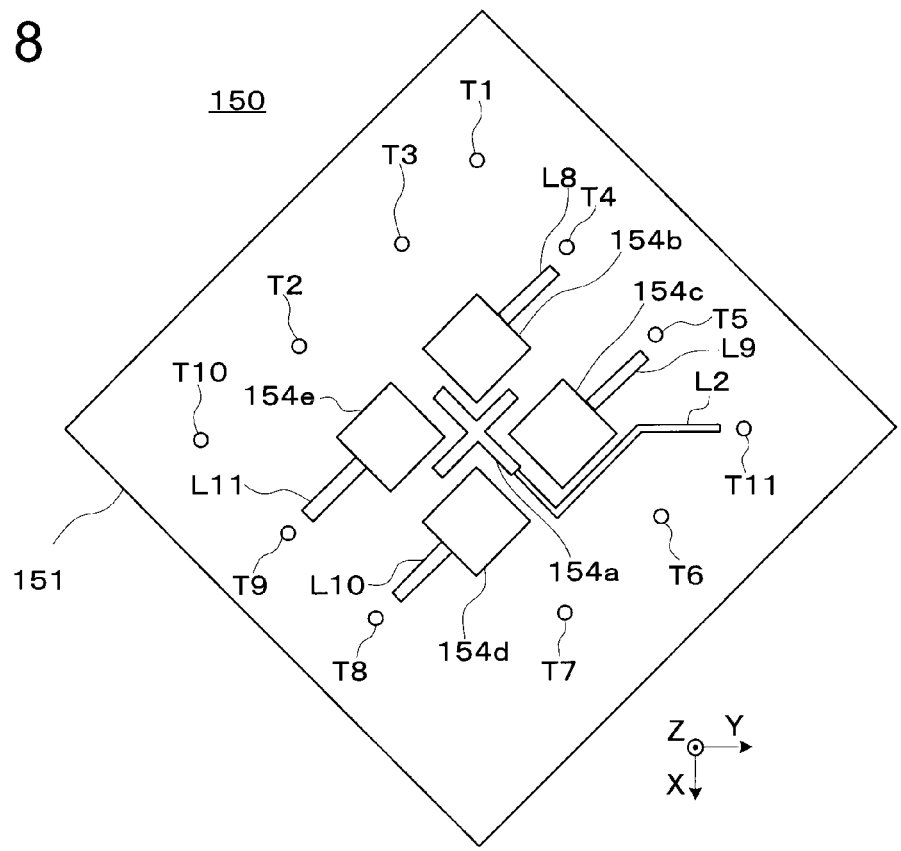
FIG. 8 is a top view of a second base.
Figures 9, 10:
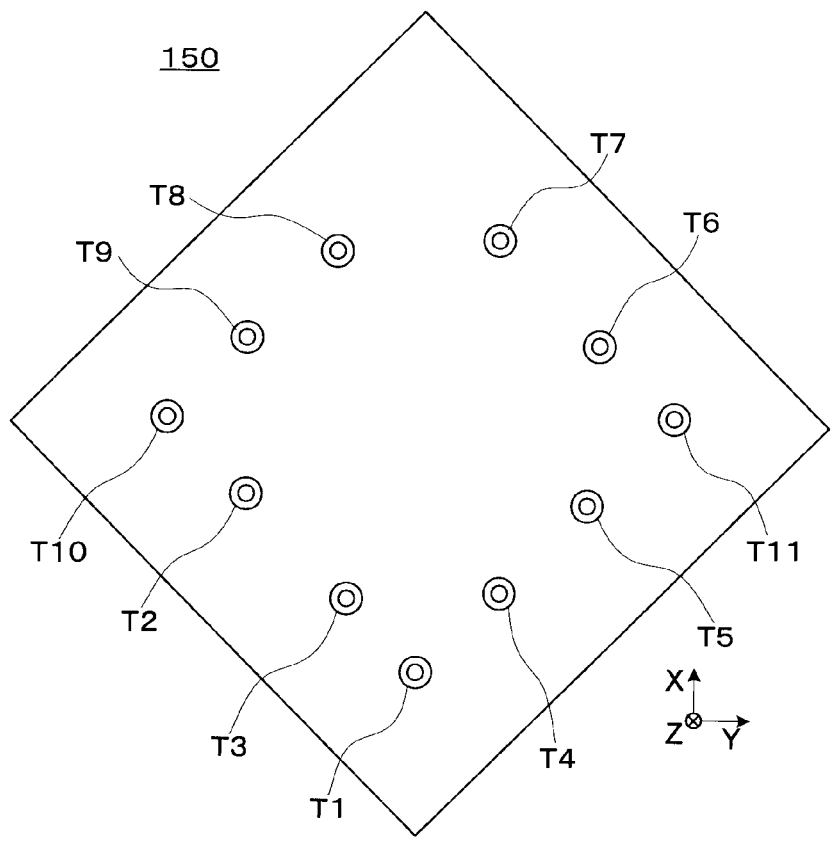
FIG. 9 is a bottom view of the second base.
FIG. 10 is a cross-sectional view taken along a line B-B in FIG. 1.
Figure 11:
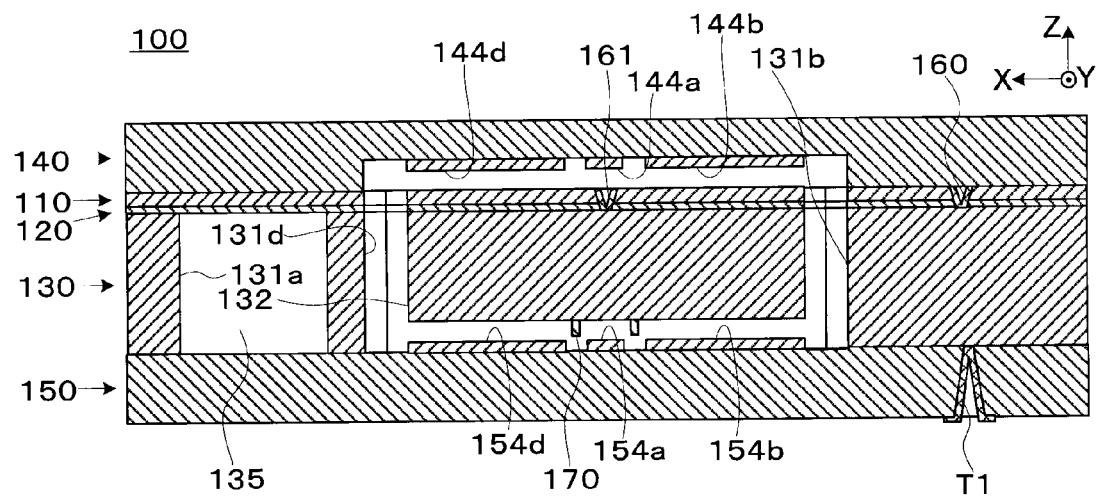
FIG. 11 is a cross-sectional view taken along a line C-C in FIG. 1.

FIG. 2 is an exploded perspective view showing a state that part (first structure 110 and second structure 130) of the mechanical quantity sensor 100 is further disassembled. FIG. 3, FIG. 4, FIG. 5, and FIG. 6 are a top view of the first structure 110, a top view of the joining part 120, a top view of the second structure 130, and a bottom view of the second structure, respectively. FIG. 7, FIG. 8, and FIG. 9 are a bottom view of the first base 140, a top view of the second base 150, and a bottom view of the second base 150, respectively. FIG. 10 and FIG. 11 are cross-sectional views of the mechanical quantity sensor 100 taken along a line B-B and a line C-C of FIG. 1.

The mechanical quantity sensor 100 functions by itself or in combination with a circuit board (for example, mounted on a board) as an electronic component. The mechanical quantity sensor 100 as an electronic component can be mounted in a game machine, a mobile terminal (for example, a cellular phone), or the like. In addition, the mechanical quantity sensor 100 and the circuit board (active elements such as IC and wiring terminals on the circuit board) are connected electrically by wire bonding, flip-chip bonding, or the like.

The mechanical quantity sensor 100 is capable of measuring one or both of an acceleration $\alpha$ and an angular velocity $\omega$. That is, a mechanical quantity means one or both of the acceleration $\alpha$ and the angular velocity $\omega$. Accelerations $\alpha x$, $\alpha y$, $\alpha z$ can be measured by detecting displacements of a displaceable portion 112 (which will be described later) caused by forces F0x, F0y, F0z in X, Y, Z-axis directions, respectively. Further, angular velocities $\omega x$, $\omega y$ in X, Y-axis directions respectively can be measured by vibrating the displaceable portion 112 in the Z-axis direction and detecting displacements of the displaceable portion 112 caused by Coriolis forces Fy, Fx in Y, X-axis directions, respectively. In this manner, the mechanical quantity sensor 100 is capable of measuring the accelerations $\alpha x$, $\alpha y$, $\alpha z$ in three axes and the angular velocities $\omega x$, $\omega y$ in two axes. Note that details of this will be described later.

The first structure 110, the joining part 120, the second structure 130, the first base 140, and the second base 150 each have a substantially square outer periphery with each side being 5 mm for example, and have heights of, for example, 20 μm, 2 μm, 675 μm, 500 μm, and 500 μm, respectively.

The first structure 110, the joining part 120, and the second structure 130 (excluding projections 170 which will be described later) can be formed of silicon, silicon oxide, and silicon, respectively, and the mechanical quantity sensor 100 can be manufactured using an SOI (Silicon On Insulator) substrate forming a three-layer structure of silicon/silicon oxide/silicon. For the silicon forming the first structure 110 and the second structure 130 (excluding projections 170), it is preferable to use a conductive material containing impurities, for example boron or the like, in its entirety. As will be described later, use of silicon containing impurities for forming the first structure 110 and the second structure 130 (excluding projections 170) allows to simplify wiring of the mechanical quantity sensor 100. In this embodiment, silicon containing impurities is used for the first structure 110 and the second structure 130 (excluding projections 170).

Further, the first base 140 and the second base 150 can each be formed of a glass material.

The first structure 110 has a substantially square outer shape, and is made up of a fixed portion 111 (111*a* to 111*c*), a displaceable portion 112 (112*a* to 112*e*), a connection portion 113 (113*a* to 113*d*), and a block upper layer portion 114

(114a to 114j). The first structure 110 can be made by etching a film of a semiconductor material and forming openings 114a to 114d and block upper layer portions 114a to 114j.

The fixed portion 111 can be separated into a frame portion 111a and projecting portions 111b, 111c. The frame portion 111a is a frame-shaped substrate with an outer periphery and an inner periphery both being a substantially square. The projecting portion 111b is a substantially square substrate, arranged at a corner portion on the inner periphery of the frame portion 111a and projecting toward the displaceable portion 112b (in a 0° direction when an X direction of the X-Y plane is 0°. The projecting portion 111c is a substantially square substrate, arranged at a corner portion on the inner periphery of the frame portion 111a and projecting toward the displaceable portion 112d (in a 180° direction when an X direction of the X-Y plane is 0°. The frame portion 111a and the projecting portions 111b, 111c are formed integrally.

The displaceable portion 112 is made up of displaceable portions 112a to 112e. The displaceable portion 112a is a substrate having a substantially square outer periphery and is arranged in the vicinity of the center of an opening of the fixed portion 111. The displaceable portions 112b to 112e are substrates each having a substantially square outer periphery and are connected and arranged so as to surround the displaceable portion 112a from four directions (X-axis positive direction, X-axis negative direction, Y-axis positive direction, and Y-axis negative direction). The displaceable portions 112a to 112e are joined respectively to weight portions 132a to 132e which will be described later by the joining part 120, and are displaced integrally relative to the fixed portion 111.

An upper face of the displaceable portion 112a functions as a driving electrode E1 (which will be described later). The driving electrode E1 on the upper face of the displaceable portion 112a capacitively couples to a driving electrode 144a, which will be described later, disposed on a lower face of the first base 140, and the displaceable portion 112 is vibrated in the Z-axis direction by voltage applied therebetween. Note that details of this driving will be described later.

Upper faces of the displaceable portions 112b to 112e each function as a detection electrode E1 (which will be described later) detecting displacements in the X-axis and Y-axis directions of the displaceable portion 112. The detection electrodes on the upper faces of the displaceable portions 112b to 112e capacitively couple respectively to detection electrodes 144b to 144e, which will be described later, disposed on a lower face of the first base 140 (the alphabets b to e of the displaceable portions 112 correspond to the alphabets b to e of the detection electrodes 144 in order respectively). Note that details of this detection will be described later.

The connection portions 113a to 113d are substantially rectangular substrates connecting the fixed portion 111 and the displaceable portion 112a in four directions (45°, 135°, 225°, 315° directions when the X direction of the X-Y plane is 0°.

Areas of the connection portions 113a to 113d close to the frame portion 111a are joined by the joining part 120 to projecting portions 131c of a pedestal 131 (which will be described later). For other areas of the connection portions 113a to 113d, that is, areas close to the displaceable portion 112a, the projecting portions 131c are not formed in the corresponding areas, and these areas have a small thickness and hence have flexibility. The reason that the areas of the connection portions 113a to 113d close to the frame portion 111a are joined to the projecting portions 131c is to prevent damage to the connection portions 113a to 113d by large deflection.

The connection portions 113a to 113d function as deflectable beams. Deflection of the connection portions 113a to 113d can displace the displaceable portion 112 relative to the fixed portion 111. Specifically, the displaceable portion 112 is displaced linearly in a Z positive direction and a Z negative direction relative to the fixed portion 111. Further, the displaceable portion 112 is capable of rotating positively or negatively with the X-axis and Y-axis being rotation axes, relative to the fixed portion 111. That is, the "displacement" mentioned here can include both movement and rotation (movement in the Z-axis direction and rotation about the X, Y axes).

The block upper layer portion 114 is made up of block upper layer portions 114a to 114j. The block upper layer portions 114a to 114j are substantially square substrates and are arranged along the inner periphery of the fixed portion 111 so as to surround the displaceable portion 112 from its periphery.

The block upper layer portions 114h, 114a have end faces facing end faces of the displaceable portion 112e, and the block upper layer portions 114b, 114c have end faces facing end faces of the displaceable portion 112b. The block upper layer portions 114d, 114e have end faces facing end faces of the displaceable portion 112c, and the block upper layer portions 114f, 114g have end faces facing end faces of the displaceable portion 112d. As shown in FIG. 1, the block upper layer portions 114a to 114h each have the end face facing one of eight end faces of the displaceable portion 112, and are arranged clockwise in alphabetical order. The block upper layer portion 114i and the block upper layer portion 114j are arranged in 90°, 270° directions when the X direction of the X-Y plane is 0°.

The block upper layer portions 114a to 114h are joined respectively to block lower layer portions 134a to 134h, which will be described later, by the joining part 120 (the alphabets a to h of the block upper layer portions 114 correspond to the alphabets a to h of the block lower layer portions 134 in order respectively). The blocks made by joining the block upper layer portions 114a to 114h and the block lower layer portions 134a to 134h, respectively, are used for the purpose of wiring for supplying power to detection electrodes 144b to 144e, 154b to 154e, which will be described later.

The block upper layer portions 114i, 114j are joined respectively to block lower layer portions 134i, 134j, which will be described later, by the joining part 120. The block made by joining the block upper layer portions 114i, 114j and the block lower layer portions 134i, 134j, respectively, are used for the purpose of wiring for vibrating the displaceable portion 112 in the Z-axis direction. Note that details of this will be described later.

The second structure 130 has a substantially square outer shape, and is made up of a pedestal 131 (131a to 131d), a weight portion 132 (132a to 132e), a block lower layer portion 134 (134a to 134j), and projections 170. The second structure 130 can be made by etching a substrate of a semiconductor material to form an opening 133, block lower layer portions 134a to 134j, and a pocket 135 (which will be described later), and forming the projections 170 by sputtering and etching. In addition, the pedestal 131 and the block lower layer portions 134a to 134j are substantially equal in height, and the weight portion 132 is lower in height than the pedestal 131 and the block lower layer portions 134a to 134j. This is for securing a space (gap) between the weight portion 132 and the second base 150 for allowing the weight portion 132 to be displaced. The pedestal 131, the block lower layer portions 134a to 134j, and the weight portion 132 are arranged separately from each other.

The pedestal 131 can be separated into a frame portion 131a and projecting portions 131b to 131d.

The frame portion 131a is a frame-shaped substrate with an outer periphery and an inner periphery both being a substantially square, and has a shape corresponding to the frame portion 111a of the fixed portion 111.

The projecting portion 131b is a substantially square substrate, arranged at a corner portion on the inner periphery of the frame portion 131a and projecting toward the weight portion 132b (in a 0° direction when the X direction of the X-Y plane is 0°, and has a shape corresponding to the projecting portion 111b of the fixed portion 111.

The projecting portions 131c are four substantially rectangular substrates, projecting toward the weight portion 132a from the frame portion 131a in 45°, 135°, 225°, 315° directions respectively when the X direction of the X-Y plane is 0°, and having one ends connected to the frame portion 131a of the pedestal 131 and the other ends arranged separately from the weight portion 132a. The projecting portions 131c are formed in substantially half areas on the frame portion 131a side in the areas corresponding to the connection portions 113a to 113d, and are not formed in other areas, that is, substantially half areas on the weight portion 132 side.

The projecting portion 131d is a substantially square substrate, arranged at a corner portion on the inner periphery of the frame portion 131a and projecting toward the weight portion 132d (in the 180° direction when X direction of the X-Y plane is 0°, in which a pocket 135 (opening) penetrating through a front face and a rear face of this substrate is formed, and is joined to the projecting portion 111c of the fixed portion 111.

The pocket 135 is a rectangular parallelepiped space for example, in which a getter material for maintaining a high vacuum is placed. One opening end of the pocket 135 is covered by the joining part 120. Most part of the other opening end of the pocket 135 is covered by the second base 150, but a part thereof near the weight portion 132 is not covered. This other opening end and the opening 133 in which the weight portion 132 and so on are formed communicate partly with each other (not shown).

The getter material absorbs a residue gas for the purpose of increasing the degree of vacuum in the mechanical quantity sensor 100 which is vacuum sealed. This allows to reduce the effect of air resistance when the displaceable portion 112 (and the weight portion 132) vibrates. As the getter material used for the mechanical quantity sensor 100, for example, a mixture of titanium and a Zr—V—Fe alloy (made by SAES Getters Japan, product name: Non-evaporable Getter St122) can be used.

The frame portion 131a and the projecting portions 131b to 131d are formed integrally.

The pedestal 131 is connected to the fixed portion 111 and predetermined areas of the connection portions 113a to 113d by the joining part 120.

The weight portion 132 functions as a heavy weight or an operating body having a mass and receiving the force F0 and the Coriolis force F caused by the acceleration $\alpha$ and the angular velocity $\omega$ respectively. That is, when the acceleration $\alpha$ and the angular velocity $\omega$ are applied, the force F0 and the Coriolis force F act on the center of gravity of the weight portion 132.

The weight portion 132 is separated into weight portions 132a to 132e having a rectangular parallelepiped shape. The weight portions 132b to 132e are connected from four directions to the weight portion 132a arranged in the center, and are displaceable (movable, rotatable) integrally as a whole.

That is, the weight portion 132a functions as a connection portion connecting the weight portions 132b to 132e.

The weight portions 132a to 132e have substantially square cross-sectional shapes corresponding to the displaceable portions 112a to 112e, respectively, and are joined to the displaceable portions 112a to 112e by the joining part 120. The displaceable portion 112 is displaced according to the force F0 and the Coriolis force F applied to the weight portion 132, and consequently, it becomes possible to measure the acceleration $\alpha$ and the angular velocity $\omega$.

The reason that the weight portion 132 is made up of the weight portions 132a to 132e is to achieve both reduction in size and increase in sensitivity of the mechanical quantity sensor 100. When the mechanical quantity sensor 100 is reduced in size (reduced in capacity), the capacity of the weight portion 132 decreases, and its mass decreases, resulting in decreased sensitivity to the mechanical quantity. Dispersed arrangement of the weight portions 132b to 132e which does not hinder deflections of the connection portions 113a to 113d assures the mass of the weight portions 132. Consequently, the reduction in size and the increase in sensitivity of the mechanical quantity sensor 100 are both achieved.

A rear face of the weight portion 132a functions as a driving electrode E1 (which will be described later). This driving electrode E1 on the rear face of the weight portion 132a capacitively couples to a driving electrode 154a, which will be described later, disposed on an upper face of the second base 150, and the displaceable portion 112 is vibrated in the Z-axis direction by voltage applied therebetween. Note that details of this driving will be described later.

Rear faces of the weight portions 132b to 132e each function as a detection electrode E1 (which will be described later) detecting a displacement of the displaceable portion 112 in the X-axis and Y-axis directions. The detection electrodes E1 on the rear faces of the weight portions 132b to 132e capacitively couple respectively to detection electrodes 154b to 154e, which will be described later, disposed on the upper face of the second base 150 (the alphabets b to e of the weight portion 132 correspond to the alphabets b to e of the detection electrodes 154 in order respectively). Note that details of this detection will be described later.

The projections 170 are arranged in the areas corresponding to areas on the rear face of the weight portion 132 where the driving electrode 154a and the detection electrodes 154b to 154e, which will be described later, are not arranged. This arrangement is for preventing, when the second base 150 and the second structure 130 are anodically bonded, the weight portion 132 from being pressed onto the driving electrode 154a and the detection electrodes 154b to 154e by electrostatic attraction, sinking into them and adhering thereto.

Figure 6:
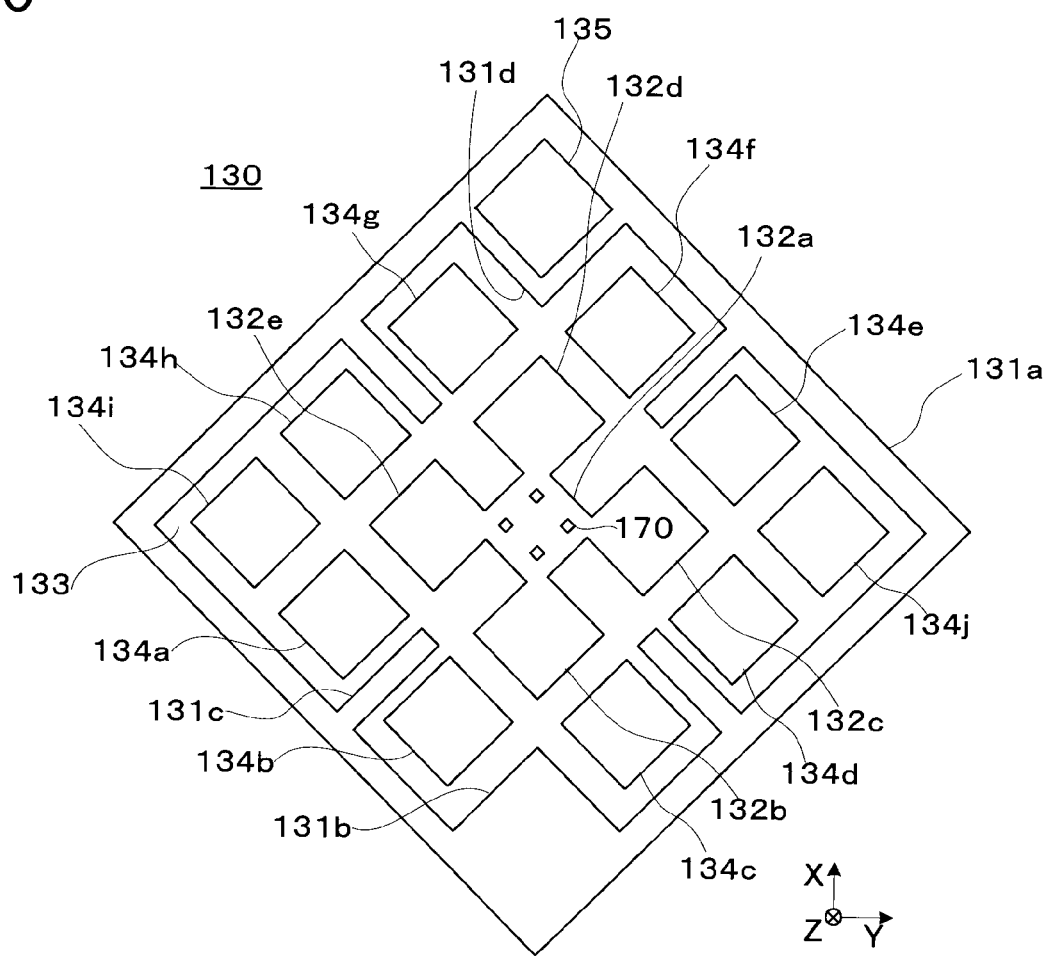
FIG. 6 is a bottom view of the second structure.

As shown in FIG. 6, in this embodiment, there are provided four projections 170 in total on the rear face of the weight portion 132a, one by one in the areas corresponding to spaces between the driving electrode 154a and the detection electrodes 154b to 154e, respectively.

Conventionally, when the second base 150 and the second structure 130 are anodically bonded (when the second glass substrate is anodically bonded), it is possible that the weight portion 132 is attracted and joined to the second base 150 by electrostatic attraction and adhering thereto, and the weight portion 132 does not operate, resulting in a state of not functioning as the mechanical quantity sensor 100.

Providing the projections 170 allows to suppress adhesion of the weight portion 132 and the projections 170 to the second base 150 even when the weight portion 132 is attracted to the second base 150 by electrostatic attraction, when the second base 150 and the second structure 130 are anodically bonded. This is because, when the projections 170 are provided, the contact area with respect to the second base 150 is smaller as compared to when the projections 170 are not provided. That is, the projections 170 function as adhesion preventing parts with respect to the second base 150.

As described above, the projections 170 are arranged in the areas corresponding to the spaces between the electrodes 154 (driving electrode 154a and detection electrodes 154b to 154e). That is, the projections 170 are arranged corresponding to areas where the electrodes 154 are not provided. This provides the following advantages 1) and 2).

1) When the second base 150 and the second structure 130 are anodically bonded, adhesion of the weight portion 132 to the second base 150 is securely prevented. That is, adhesion of the projections 170 to the electrodes 154 can be prevented. The electrodes 154 are formed of a relatively soft material such as metal, and thus when the projections 170 are arranged facing the electrodes 154, it is possible that the projections 170 sink into the electrodes 154 and adhere thereto.

2) The projections 170 do not easily affect signals on the electrodes 154. That is, changes of characteristics of the mechanical quantity sensor 100 due to addition of the projections 170 are prevented. When the projections 170 are arranged facing the electrodes 154, it is possible to affect signals on the electrodes 154 as well as characteristics of the mechanical quantity sensor 100.

It is preferable that the entire bodies or tips of the projections 170 are formed of, for example, metal such as Au, Pt, or the like which is difficult to be oxidized. With the entire bodies or tips of the projections 170 being formed of metal such as Au, Pt, or the like which is difficult to be oxidized, it is possible to prevent adhesion of the weight portion 132 and the projections 170 to the second base 150 even when the weight portion 132 is attracted to the second base 150 by electrostatic attraction, when the second base 150 and the second structure 130 are anodically bonded. This is because it is possible to prevent coupling and adhesion of oxygen atoms of the glass ($SiO_2$) forming the second base 150 to the projections 170.

The shape of the projections 170 can be, for example, a substantially rectangular parallelepiped, but it is not limited to a rectangular parallelepiped and may be of any shape. It is preferable that the heights of the projections 170 are thicker than thicknesses of the driving electrode 154a and the detection electrodes 154b to 154e so that they adequately function as adhesion preventing parts, and it can be 1 μm for example.

The block lower layer portions 134a to 134j have substantially square cross-sectional shapes corresponding to those of the block upper layer portions 114a to 114j, respectively, and are joined to the block upper layer portions 114a to 114j by the joining part 120. Blocks made by joining the block upper layer portions 114a to 114h and the block lower layer portions 134a to 134h are hereinafter referred to as "blocks a to h", respectively. The blocks a to h are used for the purpose of wirings to supply power to detection electrodes 144b to 144e, 154b to 154e, respectively. Blocks made by joining the block upper layer portions 114i, 114j and the block lower layer portions 134i, 134j, respectively (hereinafter referred to as "blocks i, j" respectively), are used for the purpose of wirings for vibrating the displaceable portion 112 in the Z-axis direction. Note that details of this will be described later.

The joining part 120 connects the first, second structures 110, 130 as already described. The joining part 120 is separated into a joining part 121 connecting the predetermined areas of the connection portions 113 and the fixed portion 111 to the pedestal 131, a joining part 122 (122a to 122e) connecting the displaceable portions 112a to 112e to the weight portions 132a to 133e, and a joining part 123 (123a to 123j) connecting the block upper layer portions 114a to 114j to the block lower layer portions 134a to 134j. Other than these portions, the joining part 120 does not connect the first and second structures 110, 130. This is for allowing the connection portions 113a to 113d to deflect and the weight portion 132 to be displaced.

In addition, the joining parts 121, 122, 123 can be formed by etching a silicon oxide film.

Conduction portions 160 to 162 are formed for establishing conduction of the first structure 110 and the second structure 130 at necessary portions.

The conduction portion 160 establishes conduction between the fixed portion 111 and the pedestal 131, and penetrates the projecting portion 111b of the fixed portion 111 and the joining part 121.

The conduction portion 161 establishes conduction between the displaceable portion 112 and the weight portion 132, and penetrates the displaceable portion 112a and the joining part 122.

The conduction portions 162 establish conduction between the block upper layer portions 114a, 114b, 114e, 114f, 114i and the block lower layer portions 134a, 134b, 134e, 134f, 134i respectively, and penetrate the block upper layer portions 114a, 114b, 114e, 114f, 114i and the joining part 123 respectively.

The conduction portions 160 to 162 are made by forming, for example, metal layers of Al or the like on, for example, edges, wall faces and bottom portions of through holes. In addition, although shapes of the through holes are not particularly limited, the through holes of the conduction portions 160 to 162 are preferred to be formed in truncated conical shapes because they allow to form metal layers effectively by sputtering or the like of Al or the like.

The first base 140 is formed of, for example, a glass material, has a substantially parallelepiped outer shape, and has a frame portion 141 and a bottom plate portion 142. The frame portion 141 and the bottom plate portion 142 can be made by forming a recessed portion 143 in a substantially rectangular parallelepiped shape (for example, 2.5 mm square and 5 μm deep) in a substrate.

The frame portion 141 has a substrate shape that is a frame shape with an outer periphery and an inner periphery both being a substantially square. The outer periphery of the frame portion 141 matches the outer periphery of the fixed portion 111, and the inner periphery of the frame portion 141 is smaller than the inner periphery of the fixed portion 111.

The bottom plate portion 142 has a substantially square substrate shape having an outer periphery that is substantially the same as that of the frame portion 141.

The reason that the recessed portion 143 is formed in the first base 140 is to secure a space for allowing the displaceable portion 112 to be displaced. The first structure 110 excluding the displaceable portion 112, that is, the fixed portion 111 and the block upper layer portions 114a to 114j are joined to the first base 140 by anodic bonding for example.

On the bottom plate portion 142 (on a rear face of the first base 140), a driving electrode 144a and detection electrodes 144b to 144e are arranged so as to face the displaceable portion 112. The driving electrode 144a and the detection electrodes 144b to 144e can all be formed of a conductive material. The driving electrode 144a is cross shaped for example and is formed in the vicinity of the center of the recessed portion 143 so as to face the displaceable portion 112a. The detection electrodes 144b to 144e each have a substantially square shape, surrounding the driving electrode 144a from four directions (the X-axis positive direction, the X-axis negative direction, the Y-axis positive direction, and the Y-axis negative direction), and are arranged to face the displaceable portions 112b to 112e in order respectively. The driving electrode 144a and the detection electrodes 144b to 144e are separated from each other.

A wiring layer L1 electrically connected to an upper face of the block upper layer portion 114i is connected to the driving electrode 144a. A wiring layer L4 electrically connected to an upper face of the block upper layer portion 114b is connected to the detection electrode 144b. A wiring layer L5 electrically connected to an upper face of the block upper layer portion 114e is connected to the detection electrode 144c. A wiring layer L6 electrically connected to an upper face of the block upper layer portion 114f is connected to the detection electrode 144d. A wiring layer L7 electrically connected to an upper face of the block upper layer portion 114a is connected to the detection electrode 144e.

As a constituent material for the driving electrode 144a, the detection electrodes 144b to 144e, and the wiring layers L1, L4 to L7, Al containing Nd can be used for example.

Use of the Al containing Nd for the driving electrode 144a, the detection electrodes 144b to 144e, and the like allows to suppress formation of hillocks on the driving electrode 144a, the detection electrodes 144b to 144e, and the like during a heat treatment process (anodic bonding of the first base 140 or the second base 150 and activation of the getter material) which will be described later. The hillocks mentioned here are, for example, hemispheric projections. Thus, dimensional accuracy can be increased for a distance between the driving electrode 144a and the driving electrode E1 (which capacitively couples to the driving electrode 144a) formed on the upper face of the displaceable portion 112a and distances between the detection electrodes 144b to 144e and the detection electrodes E1 (which capacitively couple to the detection electrodes 144b to 144e in order, respectively) formed on the upper faces of the displaceable portions 112b to 112e, respectively. Since the dimensional accuracy between the driving electrodes 144a, E1 and between the detection electrodes 144b to 144e, E1 can thus be increased, consequently dispersion of electrostatic capacitance values can be reduced, and dispersion of characteristics among products can be suppressed.

The second base 150 is made of a glass material for example, and has a substantially square substrate shape. The second structure 130 excluding the weight portion 132, that is, the pedestal 131 and the block lower layer portions 134a to 134j are joined to the second base 150 by anodic bonding for example. The weight portion 132 is lower in height than the pedestal 131 and the block lower layer portions 134a to 134j, and thus is not joined to the second base 150. This is for securing a space (gap) between the weight portion 132 and the second base 150 for allowing the weight portion 132 to be displaced.

On the upper face of the second base 150, a driving electrode 154a and detection electrodes 154b to 154e are arranged so as to face the weight portion 132. The driving electrode 154a and the detection electrodes 154b to 154e can all be formed of a conductive material. The driving electrode 154a is cross shaped for example and is formed in the vicinity of the center of the upper face of the second base 150 so as to face the weight portion 132a. The detection electrodes 154b to 154e each have a substantially square shape, surrounding the driving electrode 154a from four directions (the X-axis positive direction, the X-axis negative direction, the Y-axis positive direction, and the Y-axis negative direction), and are arranged to face the weight portions 132b to 132e in order respectively. The driving electrode 154a and the detection electrodes 154b to 154e are separated from each other.

A wiring layer L2 electrically connected to a rear face of the block lower layer portion 134j is connected to the driving electrode 154a. A wiring layer L8 electrically connected to a rear face of the block lower layer portion 134c is connected to the detection electrode 154b. A wiring layer L9 electrically connected to a rear face of the block lower layer portion 134d is connected to the detection electrode 154c. A wiring layer L10 electrically connected to a rear face of the block lower layer portion 134g is connected to the detection electrode 154d. A wiring layer L11 electrically connected to a rear face of the block lower layer portion 134h is connected to the detection electrode 154e.

As a constituent material for the driving electrode 154a, the detection electrodes 154b to 154e, and the wiring layers L2, L8 to L11, Al containing Nd can be used for example.

Use of the Al containing Nd for the driving electrode 154a and the detection electrodes 154b to 154e allows to suppress formation of hillocks on the driving electrode 154a, the detection electrodes 154b to 154e, and the like during a heat treatment process (anodic bonding of the second base 150 and activation of the getter material) which will be described later. Thus, dimensional accuracy can be increased for a distance between the driving electrode 154a and the driving electrode E1 (which capacitively couples to the driving electrode 154a) formed on a lower face of the weight portion 132a and distances between the detection electrodes 154b to 154e and the detection electrodes E1 (which capacitively couple to the detection electrodes 154b to 154e in order, respectively) formed on the upper faces of the weight portions 132b to 132e, respectively. Since the dimensional accuracy between the driving electrodes 154a, E1 and between the detection electrodes 154b to 154e, E1 can thus be increased, consequently dispersion of electrostatic capacitance values can be reduced, and dispersion of characteristics among products can be suppressed.

Wiring terminals T (T1 to T11) penetrating the second base 150 are provided in the second base 150, which allow electrical connection from the outside of the mechanical quantity sensor 100 to the driving electrodes 144a, 154a, the detection electrodes 144b to 144e, 154b to 154e.

An upper end of the wiring terminal T1 is connected to a rear face of the projecting portion 131b of the pedestal 131. The wiring terminals T2 to T9 are connected to the rear faces of the block lower layer portions 134a to 134h, respectively (the numerical order of T2 to T9 of the wiring terminals T2 to T9 corresponds to the alphabetical order of 134a to 134h of the block lower layer portions 134a to 134h, respectively). The wiring terminals T10, T11 are connected to the rear faces of the block lower layer portions 134i, 134j, respectively.

As shown in FIG. 10 and FIG. 11, the wiring terminals T are made by forming, for example, metal films of Al or the like on, for example, edges, wall faces and bottom portions of truncated conical through holes, and has structures similar to the conduction portions 160 to 162. The wiring terminals T can be used as connection terminals for connection to an external circuit by wire bonding for example.

Note that in FIG. 1 to FIG. 11, the second base 150 is illustrated to be arranged on a lower side for making it easy to see the first structure 110, the joining part 120, and the second structure 130. When the wiring terminals T and an external circuit are connected by wire bonding for example, the second base 150 of the mechanical quantity sensor 100 can be arranged on an upper side for example, so as to facilitate the connection.

(Operation and Wiring of the Mechanical Quantity Sensor 100)

The wiring and electrodes of the mechanical quantity sensor 100 will be described.

Figure 12:
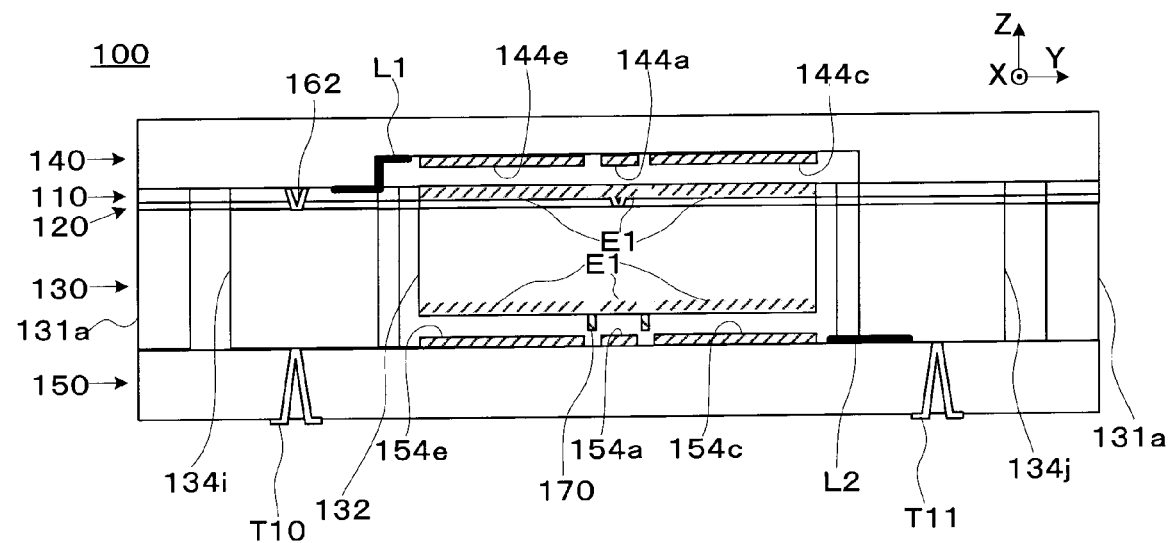
FIG. 12 is a cross-sectional view showing six pairs of capacitor elements in the mechanical quantity sensor shown in FIG. 10.

FIG. 12 is a cross-sectional view showing six pairs of capacitor elements in the mechanical quantity sensor 100 shown in FIG. 10. FIG. 11 shows a portion to function as an electrode by hatching. Note that although the six pairs of capacitor elements are shown in FIG. 11, ten pairs of capacitor elements are formed in the mechanical quantity sensor 100 as described above.

One electrodes of the ten pairs of capacitor elements are the driving electrode 144a and the detection electrodes 144b to 144e formed on the first base 140, and the driving electrode 154a and the detection electrodes 154b to 154e formed on the second base 150.

The other electrodes of the ten pairs of capacitor elements are the driving electrode E1 on the upper face of the displaceable portion 112a and the detection electrodes E1 formed respectively on the upper faces of the displaceable portions 112b to 112e, the driving electrode E1 on a lower face of the weight portion 132a, and the detection electrodes E1 formed on lower faces of the weight portions 132b to 132e, respectively. That is, a block made by joining the displaceable portion 112 and the weight portion 132 functions as a common electrode for ten pairs of capacitive couplings. Since the first structure 110 and the second structure 130 are formed of the conductive material (silicon containing impurities), the block made by joining the displaceable portion 112 and the weight portion 132 can function as an electrode.

The capacitance of a capacitor is in inverse proportion to the distance between electrodes, and thus it is assumed that the driving electrodes E1 and the detection electrodes E1 are present on an upper face of the displaceable portion 112 and a lower face of the weight portion 132. That is, the driving electrodes E1 and the detection electrodes E1 are not formed as separate bodies on outer layers of the upper face of the displaceable portion 112 and the lower face of the weight portion 132. It is understood that the upper face of the displaceable portion 112 and the lower face of the weight portion 132 function as the driving electrodes E1 and the detection electrodes E1.

The driving electrode 144a and the detection electrodes 144b to 144e formed on the first base 140 are electrically connected to the block upper layer portions 114i, 114b, 114e, 114f, 114a via the wiring layers L1, L4 to L7 in order respectively. Further, conduction between the block upper layer portions 114i, 114b, 114e, 114f, 114a and the block lower layer portions 134i, 134b, 134e, 134f, 134a respectively is established by the conduction portion 162.

The driving electrode 154a and the detection electrodes 154b to 154e formed in the second base 150 are electrically connected to the block lower layer portions 134j, 134c, 134d, 134g, 134h via the wiring layers L2, L8 to L11 in order respectively.

Therefore, wirings to these driving electrodes 144a, 154a and detection electrodes 144b to 144e, 154b to 154e just need to be connected to lower faces of the block lower layer portions 134a to 134j. The wiring terminals T2 to T9 are arranged on the lower faces of the block lower layer portions 134a to 134h respectively, and the wiring terminals T10, T11 are arranged on the lower faces of the block lower layer portions 134i, 134j respectively.

Accordingly, the wiring terminals T2 to T11 are electrically connected to the detection electrodes 144e, 144b, 154b, 154c, 144c, 144d, 154d, 154e and the driving electrodes 144a, 154a in order respectively.

The driving electrodes E1 and the detection electrodes E1 are formed by the upper face of the displaceable portion 112 and the lower face of the weight portion 132, respectively. Conduction between the displaceable portion 112 and the weight portion 132 is established by the conduction portion 161, and they are both formed of a conductive material. Conduction between the pedestal 131 and the fixed portion 111 is established by the conduction portion 160, and they are both formed of a conductive material. The displaceable portion 112, the connection portion 113, and the fixed portion 111 are formed integrally of a conductive material. Therefore, wirings to the driving electrodes E1 and the detection electrodes E1 just need to be connected to a lower face of the pedestal 131. The wiring terminal T1 is arranged on a lower face of the projecting portion 131b of the pedestal 131, and the wiring terminal T1 is electrically connected to the driving electrodes E1 and the detection electrodes E1.

As described above, since the first structure 110 and the second structure 130 are formed of the conductive material (silicon containing impurities), the blocks a to j made by joining the block upper layer portions 114a to 114j and the block lower layer portions 134a to 134j can have a function as a wiring, and thus the wirings to the capacitor elements can be simplified.

The principle of detection of the mechanical quantity by the mechanical quantity sensor 100 will be described.

(1) Vibration of Displaceable Portion 112

When voltage is applied between the driving electrodes 144a, E1, the driving electrodes 144a, E1 attract each other by Coulomb force, and the displaceable portion 112 (and the weight portion 132) is displaced in the Z-axis positive direction. Further, when voltage is applied between the driving electrodes 154a, E1, the driving electrodes 154a, E1 attract each other by Coulomb force, and the displaceable portion 112 (and the weight portion 132) is displaced in the Z-axis negative direction. That is, by applying voltage between the driving electrodes 144a, E1 and between the driving electrodes 154a, E1 alternately, the displaceable portion 112 (and the weight portion 132) vibrates in the Z-axis direction. For this application of voltage, a positive or negative direct-current waveform (or pulsed waveform when non-application time is considered), a half-wave waveform, or the like can be used.

In addition, the driving electrodes 144a, E1 (the upper face of the displaceable portion 112a) and the driving electrodes 154a, E1 (the lower face of the weight portion 132a) function as a vibration applier, and the detection electrodes 144b to 144e, 154b to 154e, and E1 (the upper faces of the displaceable portions 112b to 112e, and the lower faces of the weight portions 132b to 132e) function as a displacement detector.

The cycle of vibration of the displaceable portion 112 is determined by a switching cycle of voltage. It is preferable that this cycle of switching is close to the natural frequency of the displaceable portion 112 to some degree. The natural frequency of the displaceable portion 112 is determined by an elastic force of the connection portion 113, the mass of the weight portion 132, and the like. When the cycle of vibration applied to the displaceable portion 112 does not correspond to the natural frequency, energy of the vibration applied to the displaceable portion 112 is dispersed, and the energy efficiency decreases.

In addition, alternating voltage with a ½ frequency of the natural frequency of the displaceable portion 212 may be applied only to either between the driving electrodes 144a, E1 or between the driving electrodes 154a, E1.

(2) Generation of Force Caused by Acceleration

When the acceleration a is applied to the weight portion 132 (displaceable portion 112), the force F0 acts on the weight portion 132. Specifically, according to the accelerations αx, αy, αz in the X, Y, Z-axis directions respectively, the forces F0x (=m·αx), F0y (=m·αy), F0z (=m·αz) in the X, Y, Z-axis directions act on the weight portion 132 (m is the mass of the weight portion 132). As a result, slants in the X, Y directions and displacement in the Z direction occur in the displaceable portion 112. Thus, the accelerations αx, αy, αz cause the slants (displacements) in the displaceable portion 112 in the X, Y, Z directions.

(3) Generation of Coriolis Force Caused by Angular Velocity

When the weight portion 132 (displaceable portion 112) moves in the Z-axis direction at a velocity vz, application of the angular velocity ω causes a Coriolis force F to act on the weight portion 132. Specifically, according to the angular velocity ωx in the X-axis direction and the angular velocity ωy in the Y-axis direction respectively, Coriolis force Fy in the Y-axis direction (=2·m·vz∩ωx) and Coriolis force Fx (=2·m·vz·ωy) in the X-axis direction act on the weight portion 132 (m is the mass of the weight portion 132).

When the Coriolis force Fy caused by the angular velocity ωx in the X-axis direction is applied, a slant in the Y direction occurs in the displaceable portion 112. Thus, slants (displacements) in the Y direction and X direction are generated in the displaceable portion 112 by Coriolis forces Fy, Fx caused by the angular velocities ωx, ωy.

(4) Detection of Displacement of the Displaceable Portion 112

As described above, a displacement (slant) of the displaceable portion 112 is caused by the acceleration a and the angular velocity ω. The displacement of the displaceable portion 112 can be detected by the detection electrodes 144b to 144e, 154b to 154e.

When the force F0 z in the Z positive direction is applied to the displaceable portion 112, distances between the detection electrodes E1 (the upper face of the displaceable portion 112c), 144c and between the detection electrodes E1 (the upper face of the displaceable portion 112e), 144e both become small. Consequently, capacitances between the detection electrodes E1 (the upper face of the displaceable portion 112c), 144c and between the detection electrodes E1 (the upper face of the displaceable portion 112e), 144e both become large. That is, based on the sum of capacitances between the detection electrodes E1 and the detection electrodes 144b to 144e (or the sum of capacitances between the detection electrodes E1 and the detection electrodes 154b to 154e), the displacement in the Z direction of the displaceable portion 112 can be detected and extracted as a detection signal.

On the other hand, when the force F0 y or the Coriolis force Fy in the Y positive direction is applied to the displaceable portion 112, distances between the driving electrodes E1 (the upper face of the displaceable portion 112c), 144c and between the detection electrodes E1 (the lower face of the weight portion 132e), 154e become small, and distances between the detection electrodes E1 (the upper face of the displaceable portion 112e), 144e and the detection electrodes E1 (the lower face of the weight portion 132c), 154c become large. Consequently, capacitances between the detection electrodes E1 (the upper face of the displaceable portion 112c), 144c and between the detection electrodes E1 (the lower face of the weight portion 132e), 154e become large, and capacitances between the detection electrodes E1 (the upper face of the displaceable portion 112e), 144e and the detection electrodes E1 (the lower face of the weight portion 132c), 154c become small. That is, based on differences in capacitance between the detection electrodes E1 and the detection electrodes 144b to 144e, 154b to 154e, a change in slant in the X, Y directions of the displaceable portion 112 can be detected and extracted as a detection signal.

As described above, a slant in the X direction and the Y direction and a displacement in the Z direction of the displaceable portion 112 are detected by the detection electrodes E1, 144b to 144e, 154b to 154e.

(5) Extraction of Acceleration and Angular Velocity from Detection Signals

Signals outputted from the detection electrodes 144b to 144e, 154b to 154e, E1 include components caused by both the accelerations αx, αy, αz and the angular velocities ωx, ωy. Using a difference between these components, the acceleration and the angular velocity can be extracted.

A force Fα (=m·α) of when an acceleration a is applied to the weight portion 132 (mass m) does not depend on vibration of the weight portion 132. Specifically, an acceleration component in a detection signal is a kind of bias component that does not correspond to vibration of the weight portion 132. On the other hand, a force Fω (=2·m·vz·ω) of when the angular velocity ω is applied to the weight portion 132 (mass m) depends on the velocity vz in the Z-axis direction of the weight portion 132. That is, an angular velocity component in a detection signal is a kind of amplitude component that cyclically changes corresponding to vibration of the weight portion 132.

Specifically, the bias component (acceleration) with a frequency lower than a vibration frequency of the displaceable portion 112 and a vibration component (angular velocity) similar to the vibration frequency of the displaceable portion 112 are extracted by frequency analysis of the detection signal. Consequently, it becomes possible to measure the accelerations αx, αy, αz in the X, Y, Z directions (three axes) and the angular velocities ωx, ωy in the X, Y directions (two axes) by the mechanical quantity sensor 100.

(Making of Mechanical Quantity Sensor 100)

Steps of making the mechanical quantity sensor 100 will be described.

Figure 13:
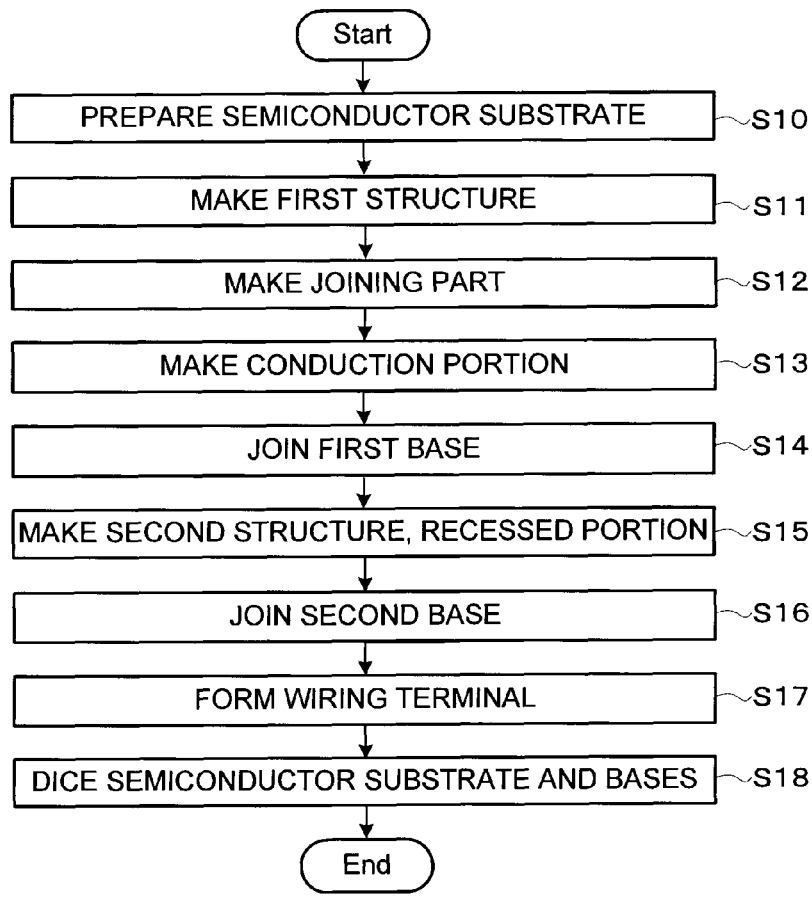
FIG. 13 is a flowchart showing an example of a making procedure of the mechanical quantity sensor according to the first embodiment of the present invention.

FIG. 13 is a flowchart showing an example of a making procedure of the mechanical quantity sensor 100. Further, FIG. 14A to FIG. 14K are cross-sectional views showing states of the mechanical quantity sensor 100 (corresponding to a cross section of the mechanical quantity sensor 100 taken along a line C-C in FIG. 1) during the making procedure in FIG. 13. FIG. 14A to FIG. 14K correspond to upside-down arrangements of the mechanical quantity sensor 100 of FIG. 11.

Figure 14A:
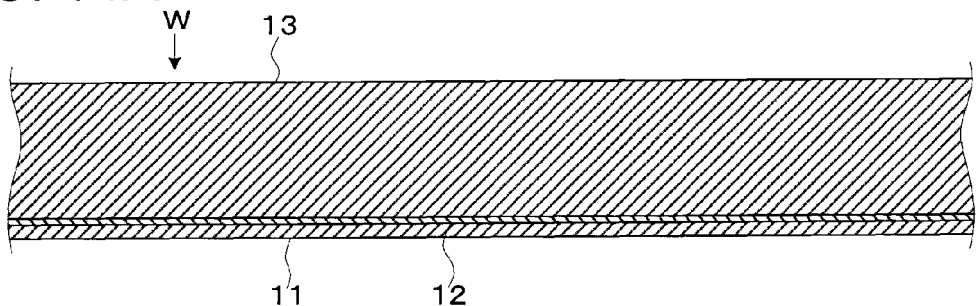
FIG. 14A is a cross-sectional view showing a state of the mechanical quantity sensor in the making procedure in FIG. 13.

(1) Preparation of Semiconductor Substrate W (Step S10, and FIG. 14A)

As shown in FIG. 14A, there is prepared a semiconductor substrate W formed by stacking three layers, first, second, and third layers 11, 12, 13.

The first, second, and third layers 11, 12, 13 are layers for forming the first structure 110, the joining part 120, the second structure 130 respectively, and here they are formed of silicon containing impurities, a silicon oxide, and silicon containing impurities.

The semiconductor substrate W having a stack structure of the three layers of silicon containing impurities/silicon oxide/silicon containing impurities can be made by joining a substrate obtained by stacking a silicon oxide film on a silicon substrate containing impurities and a silicon substrate containing impurities, and thereafter polishing the latter silicon substrate containing impurities to make it thin (what is called an SOI substrate).

Here, the silicon substrate containing impurities can be manufactured by, for example, doping boron during manufacturing of a silicon single crystal by a Czochralski method.

An example of the impurities contained in the silicon is boron. As the silicon containing boron, for example, one containing high-concentration boron and having resistivity of 0.001 Ω·cm to 0.01 Ω·cm can be used.

Note that here the first layer 11 and the third layer 13 are formed of the same material (silicon containing impurities), but the first, second, and third layers 11, 12, 13 may all be formed of different materials.

Figure 14B:
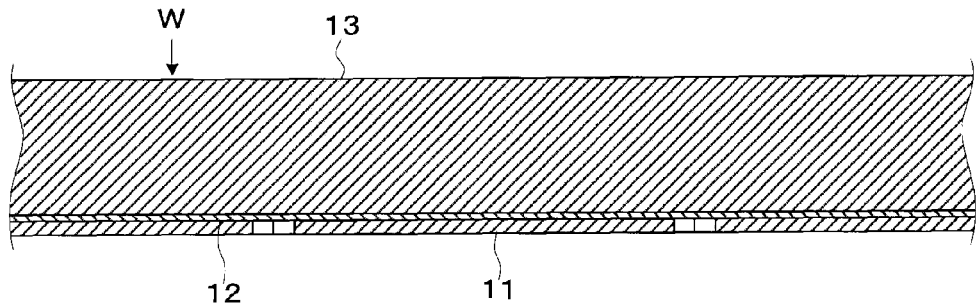
FIG. 14B is a cross-sectional view showing a state of the mechanical quantity sensor in the making procedure in FIG. 13.

(2) Making of First Structure 110 (Etching of First Layer 11, Step S11, and FIG. 14B)

The first layer 11 is etched to form an opening 115, and form the first structure 110. That is, using an etching method which can erode the first layer 11 but does not erode the second layer 12, predetermined areas (openings 115*a* to 115*d*) of the first layer 11 is etched in a thickness direction until an upper face of the second layer 12 is exposed.

A resist layer having a pattern corresponding to the first structure 110 is formed on an upper face of the first layer 11, and exposed portions not covered by this resist layer are eroded downward vertically. In this etching step, the second layer 12 is not eroded, and only the predetermined areas (openings 115*a* to 115*d*) of the first layer 11 are removed.

FIG. 14B shows a state that the first layer 11 is etched as described above to form the first structure 110.

Figure 14C:
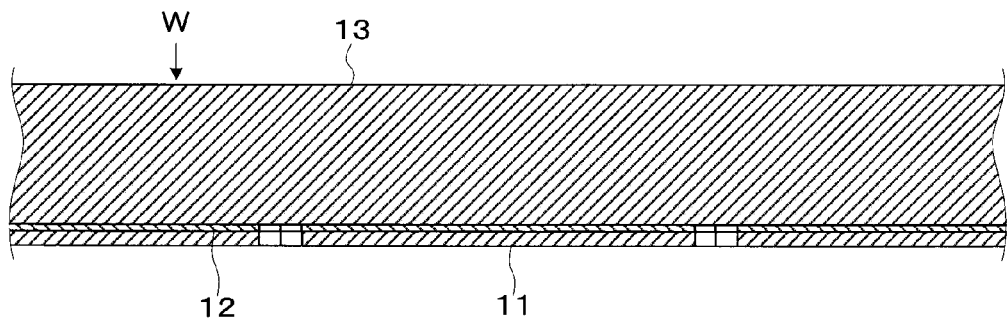
FIG. 14C is a cross-sectional view showing a state of the mechanical quantity sensor in the making procedure in FIG. 13.

(3) Making of Joining Part 120 (Etching of Second Layer 12, Step S12, and FIG. 14C)

The second layer 12 is etched to thereby form the joining part 120. Specifically, the second layer 12 is etched from its exposed portions in the thickness direction and a layer direction, by an etching method which can erode the second layer 12 but does not erode the first layer 11 and the third layer 13.

In this etching step, it is unnecessary to form a resist layer separately. That is, the first structure 110 being a residue portion of the first layer 11 functions as a resist layer for the second layer 12. The etching is performed on an exposed portion of the second layer 12.

In the etching step (Step S12) on the second layer 12, it is necessary to perform an etching method that satisfies the following two conditions. The first condition is to have directions in the thickness direction as well as the layer direction. The second condition is that it can erode a silicon oxide layer but cannot erode a silicon layer.

The first condition is a condition necessary for not allowing the silicon oxide layer to remain on an unnecessary portion and inhibit freedom of displacement of the weight portion 132. The second condition is a condition necessary for not allowing the erosion to reach the first structure 110, on which processing to make a predetermined shape is already completed, and the third layer 13, which are formed of silicon.

As an etching method that satisfies the first and second conditions, there is wet etching using buffered hydrofluoric acid (for example, a mixed aqueous solution of HF=5.5 wt %, NH$_4$F=20 wt %) as an etching solution. Further, dry etching by an RIE method using a mixed gas of CF$_4$ gas and O$_2$ gas is also applicable.

Figure 14D:
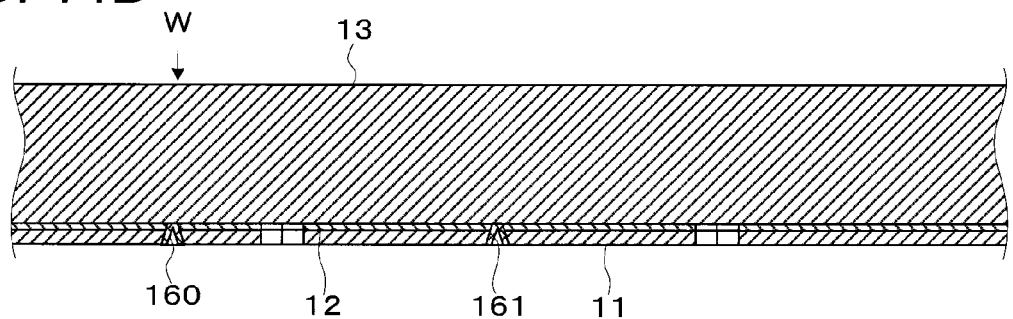
FIG. 14D is a cross-sectional view showing a state of the mechanical quantity sensor in the making procedure in FIG. 13.

(4) Formation of Conduction Portions 160 to 162 (Step S13, and FIG. 14D)

The conduction portions 160 to 162 are formed as a, b below.

a. Formation of Conical Through Holes

Predetermined positions of the first structure 110 and the second layer 12 are wet etched, and weight-shaped through holes penetrating up to the second layer 12 are formed. As the etching solution, a 20% TMAH (tetramethylammonium hydroxide) can be used for example to etch the first structure 110, and buffered hydrofluoric acid (for example, a mixed aqueous solution of HF=5.5 wt %, NH$_4$F=20 wt %) can be used for example to etch the second layer 12.

b. Formation of Metal Layers

On the upper face of the first structure 110 and in the conical through holes, Al for example is deposited by a vapor deposition method, a sputtering method, or the like, so as to form the conduction portions 160 to 162. Unnecessary metal layers (metal layers outside edges (not shown) of upper ends of the conduction portions 160 to 162) deposited on the upper face of the first structure 110 are removed by etching.

Figure 14E:
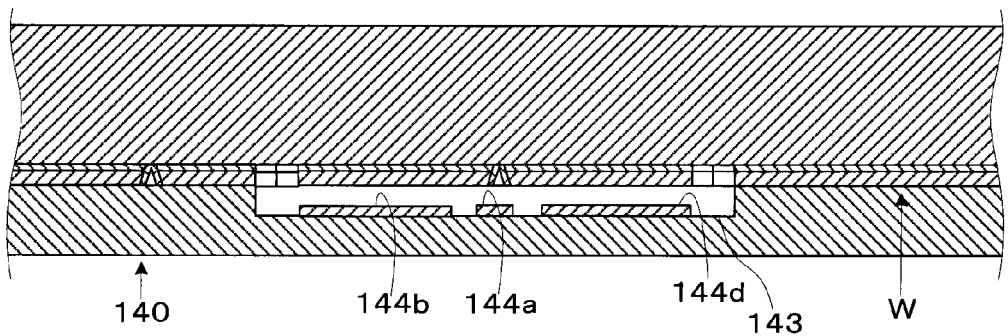
FIG. 14E is a cross-sectional view showing a state of the mechanical quantity sensor in the making procedure in FIG. 13.

(5) Joining of First Base 140 (Step S14 and FIG. 14E)

1) Making of First Base 140

A substrate formed of an insulating material, for example, a glass substrate is etched to form the recessed portion 143, and then the driving electrode 144*a*, the detection electrodes 144*b* to 144*e*, and the wiring layers L1, L4 to L7 are formed at predetermined positions by a pattern formed of Al containing Nd for example.

2) Joining of Semiconductor Substrate W and First Base 140

The semiconductor substrate W and the first base 140 are joined by anodic bonding for example. The first base 140 is anodically bonded before making the second structure 130. Since the first base 140 is anodically bonded before forming the weight portion 132, no thin area exists in the connection portions 113*a* to 113*d*, and thus they do not have flexibility. Thus, the displaceable portion 112 is not attracted to the first base 140 when electrostatic attraction occurs. Accordingly, joining of the first base 140 and the displaceable portion 112 can be prevented.

FIG. 14E shows a state that the semiconductor substrate W and the first base 140 are joined.

Figure 14F:
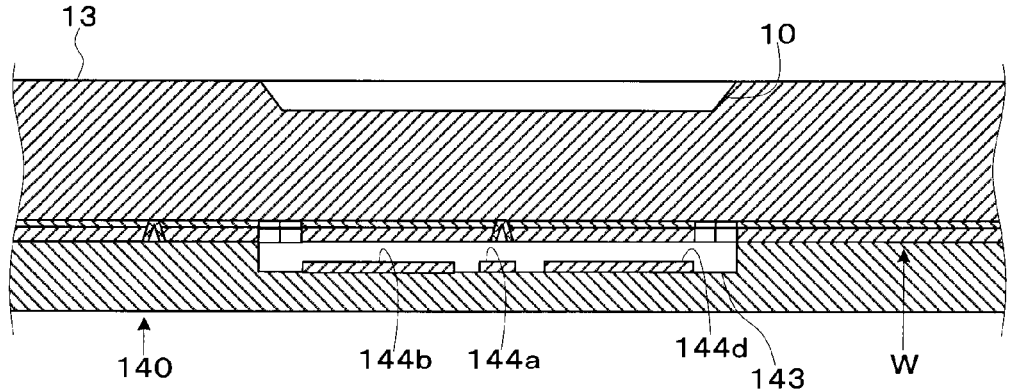
FIG. 14F is a cross-sectional view showing a state of the mechanical quantity sensor in the making procedure in FIG. 13.
Figure 14G:
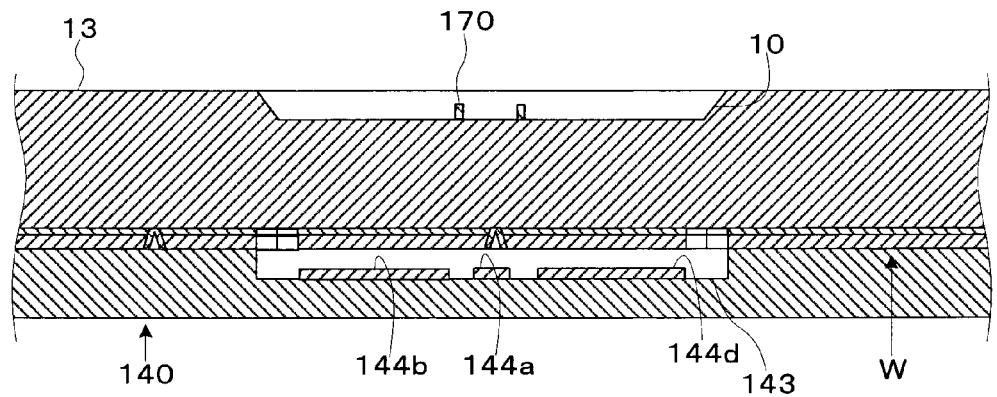
FIG. 14G is a cross-sectional view showing a state of the mechanical quantity sensor in the making procedure in FIG. 13.
Figure 14H:
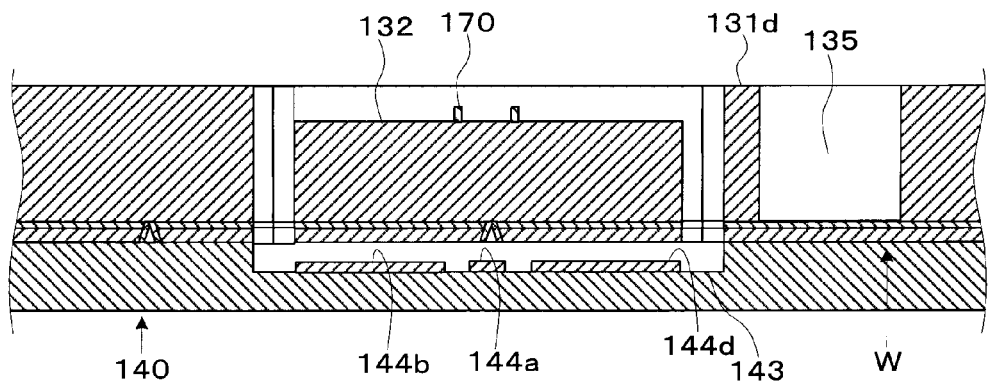
FIG. 14H is a cross-sectional view showing a state of the mechanical quantity sensor in the making procedure in FIG. 13.

(6) Second Structure 130 (Etching Third Layer 13 and Making Projections 170, Step S15, and FIG. 14F to FIG. 14H)

The second structure 130 is made as a to c below.

a. Formation of Gap 10 (FIG. 14F)

On the upper face of the third layer 13 excluding the formation area for the weight portion 132 and its vicinity, a resist layer is formed, and an exposed portion (formation area for the weight portion 132 and its vicinity) not covered by this resist layer is eroded downward vertically. As a result, the gap 10 for allowing the weight portion 132 to be displaced is formed above the area where the weight portion 132 is to be formed.

b. Formation of Projections 170 (FIG. 14G)

After the gap 10 is formed, projections 170 are formed at predetermined positions on an upper face of the area where the weight portion 132 is formed.

Metal layers, for example, a Cr layer and an Au layer are formed in this order by a vapor deposition method, a sputtering method, or the like on the upper face of the area where the weight portion 132 is formed. Unnecessary metal layers (metal layers outside the projections 170) are removed by etching, thereby forming the projections 170.

Conventionally, when the second base 150 and the second structure 130 are anodically bonded (when the second glass substrate is anodically bonded), it is possible that the weight portion 132 is attracted and joined to the second base 150 by electrostatic attraction and adhering thereto, and the weight portion 132 does not operate, resulting in a state of not functioning as the mechanical quantity sensor 100.

Providing the projections 170 allows to suppress adhesion of the weight portion 132 to the second base 150 even when the weight portion 132 is attracted to the second base 150 by electrostatic attraction, when the second base 150 and the second structure 130 are anodically bonded. This is because, when the projections 170 are provided, the contact area with respect to the second base 150 is smaller as compared to when the projections 170 are not provided.

Since the tips of the projections 170 are formed of metal such as Au or the like which is difficult to be oxidized, it is possible to prevent adhesion of the weight portion 132 and the projections 170 to the second base 150 even when the weight portion 132 is attracted to the second base 150 by electrostatic attraction, when the second base 150 and the second structure 130 are anodically bonded. This is because it is possible to prevent coupling and adhesion of oxygen atoms of the glass ($SiO_2$) forming the second base 150 to the projections 170.

c. Formation of Second Structure 130 (FIG. 14H)

The third layer 13 in which the projections 170 are formed is etched to form the opening 133, the block lower layer portions 134a to 134j, and the pocket 135, thereby forming the second structure 130. Specifically, a predetermined area (opening 133) of the third layer 13 is etched in the thickness direction by an etching method that erodes the third layer 13 and does not erode the second layer 12.

A resist layer having a pattern corresponding to the second structure 130 is formed on the upper face of the third layer 13, and an exposed portion not covered by this resist layer is eroded downward vertically.

FIG. 14H shows a state that the second structure 130 is formed by etching the third layer 13 as described above.

In the above manufacturing process, it is necessary to perform an etching method as follows in the step of forming the first structure 110 (Step S11), and the step of forming the second structure 130 (Step S15).

A first condition is to have directions in the thickness direction of each layer. A second condition is that it erodes a silicon layer but does not erode a silicon oxide layer.

An etching method satisfying the first condition is ICP etching method (Inductively-Coupled Plasma Etching Method). This etching method is effective for opening a deep trench in a vertical direction, and is a kind of etching method that is generally called DRIE (Deep Reactive Ion Etching).

In this method, an etching stage of digging while eroding a material layer in a thickness direction and a deposition stage of forming a polymer wall on a side face of the dug hole are repeated alternately. The side face of the dug hole is protected by a polymer wall that is formed sequentially, and thus it becomes possible to allow the erosion to proceed almost only in the thickness direction.

On the other hand, to perform etching satisfying the second condition, an etching material having etching selectivity between a silicon oxide and silicon may be used. For example, it is conceivable to use a mixed gas of $SF_6$ gas and $O_2$ gas in the etching stage, and use a $C_4F_8$ gas in the deposition stage.

Incidentally, the order of the above-described formation of the projections 170 (b) and formation of the second structure 130 (c) may be switched.

Figure 14I:
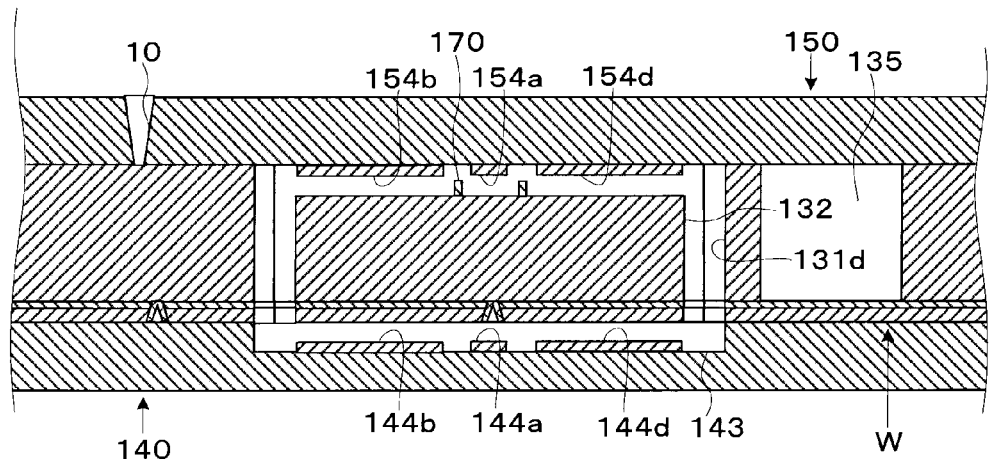
FIG. 14I is a cross-sectional view showing a state of the mechanical quantity sensor in the making procedure in FIG. 13.

(7) Joining of Second Base 150 (Step S16, and FIG. 14I)

1) Formation of Second Base 150

In a substrate formed of an insulating material, the driving electrode 154a, the detection electrodes 154b to 154e, and the wiring layers L2, L8 to L11 are formed at predetermined positions with a pattern formed of Al containing Nd for example. Further, the second base 150 is etched to form 11 truncated conical through holes 10 for forming the wiring terminals T1 to T11 at predetermined positions.

2) Joining of Semiconductor Substrate W and Second Base 150

A getter material (made by, for example, SAES Getters Japan, product name: Non-evaporable Getter St122) is put in the pocket 135, and the second base 150 and the semiconductor substrate W are joined by anodic bonding for example.

On the rear face of the weight portion 132, the projections 170 having tips formed of, for example, metal such as Au which is difficult to be oxidized are provided. Accordingly, as described above, it is possible to prevent adhesion of the weight portion 132 and the projections 170 to the second base 150 even when the weight portion 132 is attracted to the second base 150 by electrostatic attraction, when the second base 150 and the second structure 130 are anodically bonded.

FIG. 14I shows a state that the semiconductor substrate W and the second base 150 are joined.

Figure 14J:
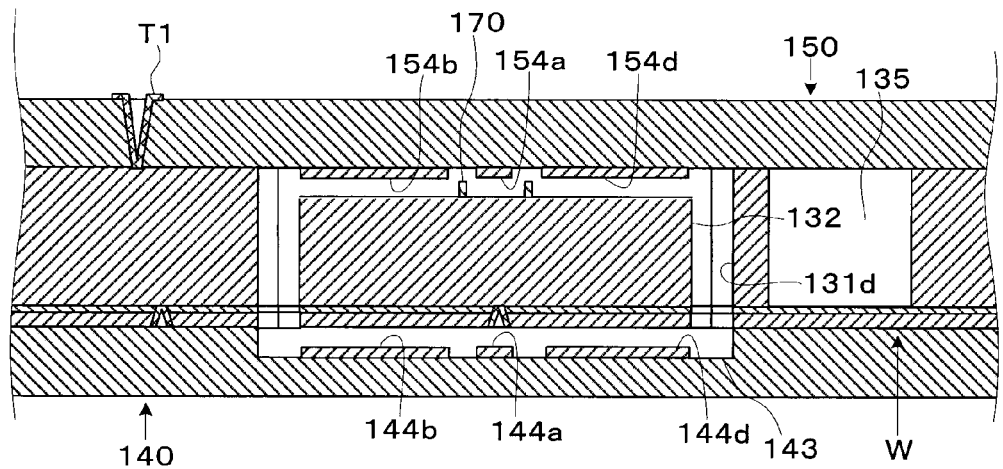
FIG. 14J is a cross-sectional view showing a state of the mechanical quantity sensor in the making procedure in FIG. 13.

(8) Formation of the wiring terminals T1 to T11 (Step S17 and FIG. 14J)

Metal layers, for example, a Cr layer and an Au layer are formed in this order by a vapor deposition method, a sputtering method, or the like on the upper face of the second base 150 and in the conical through holes 10. Unnecessary metal layers (metal layers outside edges of upper ends of the wiring terminals T) are removed by etching, thereby forming the wiring terminals T1 to T11.

Figure 14K:
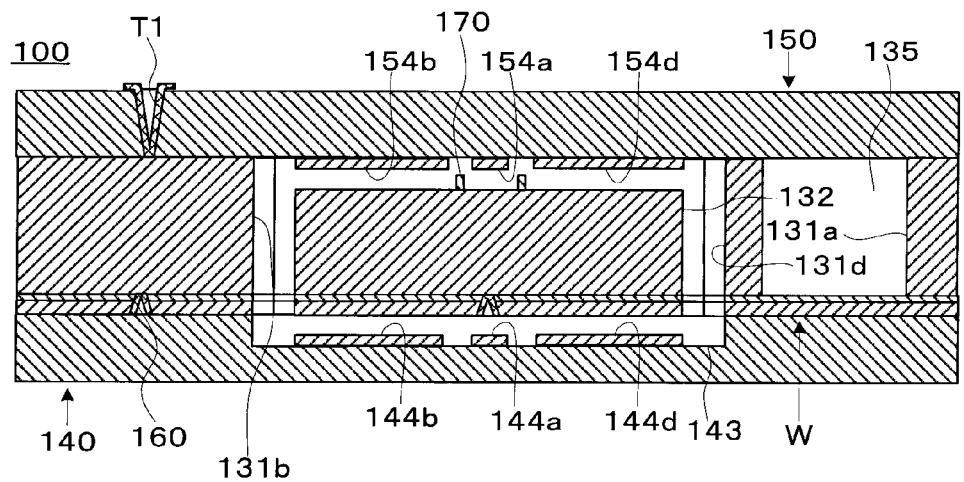
FIG. 14K is a cross-sectional view showing a state of the mechanical quantity sensor in the making procedure in FIG. 13.

(9) Dicing of Semiconductor Substrate W, First Base 140, and Second Base 150 (Step S18 and FIG. 14K)

The getter material in the pocket 135 is activated by, for example, heat treatment at 400° C., and thereafter the semiconductor substrate W, the first base 140, and the second base 150 joined together are cut by a dicing saw or the like, to thereby separate them into individual mechanical quantity sensors 100.

Modification Example

The mechanical quantity sensor 100 as above has the entire bodies or tips of the projections 170 being formed of, for example, metal such as Au, Pt or the like which is difficult to be oxidized.

On the other hand, the projections may be formed of, for example, an insulating material such as a silicon oxide or a silicon nitride.

Figure 15:
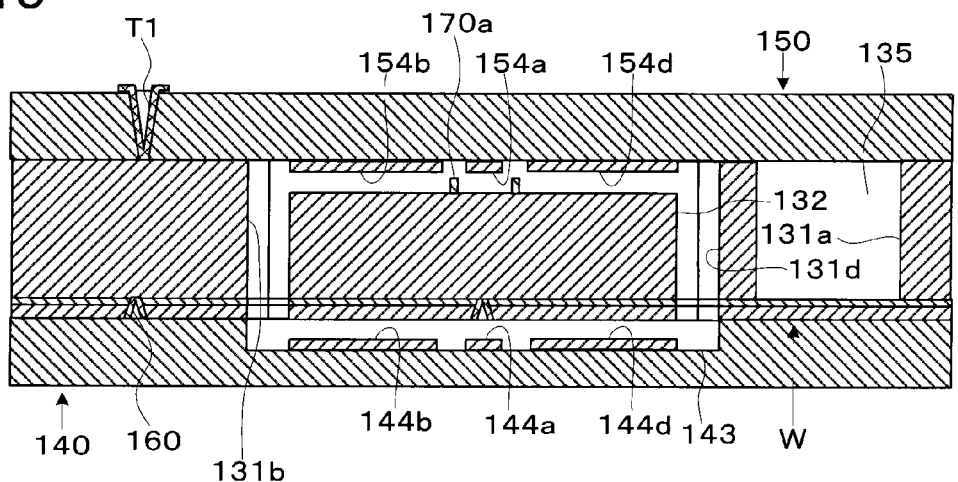
FIG. 15 is a partial cross-sectional view showing a main part of the mechanical quantity sensor according to a modification example.

FIG. 15 is a partial cross-sectional view showing a main part of a mechanical quantity sensor according to this modification example.

The mechanical quantity sensor according to this modification example has projections 170a formed of an insulating material such as a silicon oxide or a silicon nitride for example on the upper face of the weight portion 132a. Providing the projections 170a allows to suppress adhesion of the weight portion 132 and the projections 170a to the second base 150 even when the weight portion 132 is attracted to the second base 150 by electrostatic attraction, when the second base 150 and the second structure 130 are anodically bonded. That is, the projections 170a function as adhesion preventing parts with respect to the second base 150.

The projections 170a are arranged in the areas corresponding to areas, on the rear face of the weight portion 132 facing the second base 150, where the driving electrode 154a and the detection electrodes 154b to 154e are not arranged. The reason that the projections 170a are provided in the areas corresponding to the areas where the driving electrode 154a and the detection electrodes 154b to 154e are not arranged is to prevent, when the second base 150 and the second structure 130 are anodically bonded, the projections 170a from being pressed onto the driving electrode 154a and the detection electrodes 154b to 154e by electrostatic attraction, sinking into them and adhering thereto.

Similarly to the projections 170 of the first embodiment shown in FIG. 6, there are provided four projections 170a in total according to this modification example on the rear face of the weight portion 132a, one by one in the areas corresponding to spaces between the driving electrode 154a and the detection electrodes 154b to 154e, respectively.

The shape of the projections 170a can be, for example, a substantially rectangular parallelepiped, but it is not limited to a rectangular parallelepiped and may be of any shape. It is preferable that the heights of the projections 170a are thicker than thicknesses of the driving electrode 154a and the detection electrodes 154b to 154e so that they adequately function as adhesion preventing parts, and it can be 1 μm for example.

Here, it will be described the principle of functioning of the projections 170a formed of an insulating material such as a silicon oxide or a silicon nitride as the adhesion preventing parts when the weight portion 132 is attracted to the second base 150 by electrostatic attraction when the second base 150 and the second structure 130 are anodically bonded.

Figure 16:
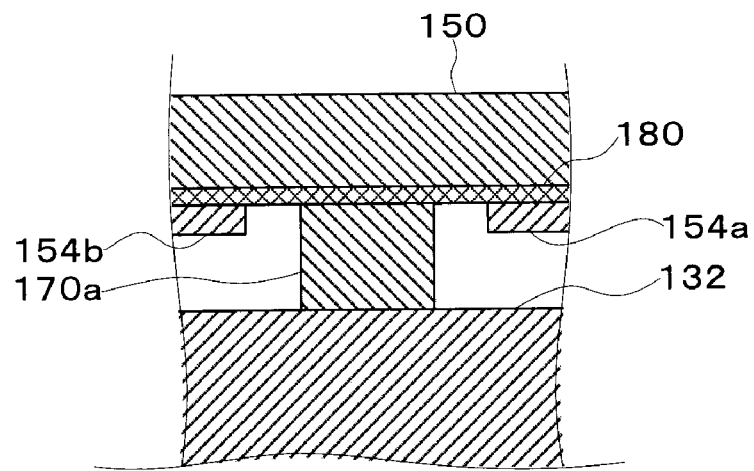
FIG. 16 is a view showing a state that a weight portion is attracted to the second base by electrostatic attraction and a projection and the second base are in contact, when the second base and the second structure are anodically bonded.
Figure 17:
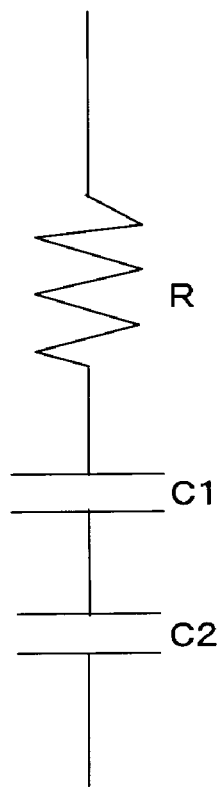
FIG. 17 is an explanatory diagram showing the principle of functioning of a projection formed of an insulating material as an adhesion preventing part.

FIG. 16 is a view showing a state that the weight portion 132 is attracted to the second base 150 by electrostatic attraction when the second base 150 and the second structure 130 are anodically bonded, and a projection 170a is in contact with the second base 150. As a result of movement of cations from the second base 150 due to the anodic bonding, a negative space-charge layer 180 is formed in the vicinity of the surface on the side close to the weight portion 132 of the second base 150. The projection 170a can be assumed as a capacitor C1, the space-charge layer 180 as a capacitor C2, and the second base 150 as a resistor R, and thus the structure in FIG. 16 can be represented by an equivalent circuit shown in FIG. 17 in which the resistor R and the two capacitors C1, C2 are connected in series.

At the moment that voltage is applied (t=0), the voltage to be applied to the capacitors C1, C2 is zero since no charge is accumulated, and thus the entire voltage is applied to the resistor R.

After a sufficiently long time has elapsed (t=∞), the current becomes zero, and the voltage is applied to the two capacitors C1, C2. In practice, the voltage to be applied to the space-charge layer 180 is sufficiently small, and it can be approximated that the entire voltage is applied to the projection 170a. After the sufficiently long time has elapsed, energy Φ accumulated in the projection 170a can be expressed by the following equation (1).

$$\Phi = (1/2) C V_0^2 \quad \text{equation (1)}$$

Here, $C = \epsilon_r \epsilon_0 (S/d)$ is the capacitance of a capacitor, $V_0$ is applied voltage, $\epsilon_r$ is a relative dielectric constant, $\epsilon_0$ is a dielectric constant in vacuum, S is a cross-sectional area of the projection 170a, d is the height of the projection 170a (equal to the distance between the weight portion 132 and the second base 150 in FIG. 16).

Attraction F between electrodes of the capacitor C1 is expressed by the following equation (2).

$$F = -(d\Phi/dx)_{x=d} = \epsilon_r \epsilon_0 V_0^2 / 2d^2 \quad \text{equation (2)}$$

Therefore, when the second base 150 is anodically bonded, in a state that the weight portion 132 is attracted to the second base 150 by electrostatic attraction and the projection 170a is in contact with the second base 150, the electrostatic attraction working on the weight portion 132 and the second base 150 is in inverse proportion to the square of the height d of the projection 170a. Accordingly, even when the weight portion 132 is attracted to the second base 150 by electrostatic attraction during anodic bonding, the distance between the weight portion 132 and the second base 150 can be made large by providing the projection 170a, and thus the electrostatic attraction can be reduced. In this manner, the projection 170a formed of an insulating material such as a silicon oxide, a silicon nitride, or the like functions as an adhesion preventing part that suppresses adhesion of the weight portion 132 and the projection 170a to the second base 150 during anodic bonding.

Next, a method of making the projections 170a will be described.

In this example, instead of making the projections 170 in step S15 (forming the second structure 130) in the method of making the mechanical quantity sensor 100 in the first embodiment, the projections 170a formed of an insulating material such as a silicon oxide, silicon nitride, or the like will be made.

A silicon nitride layer is formed by a CVD method for example on the upper face of the area where the weight portion 132 is formed, and the projections 170a are formed by RIE (Reactive Ion Etching) with a resist being a mask.

Second Embodiment

Figure 18:
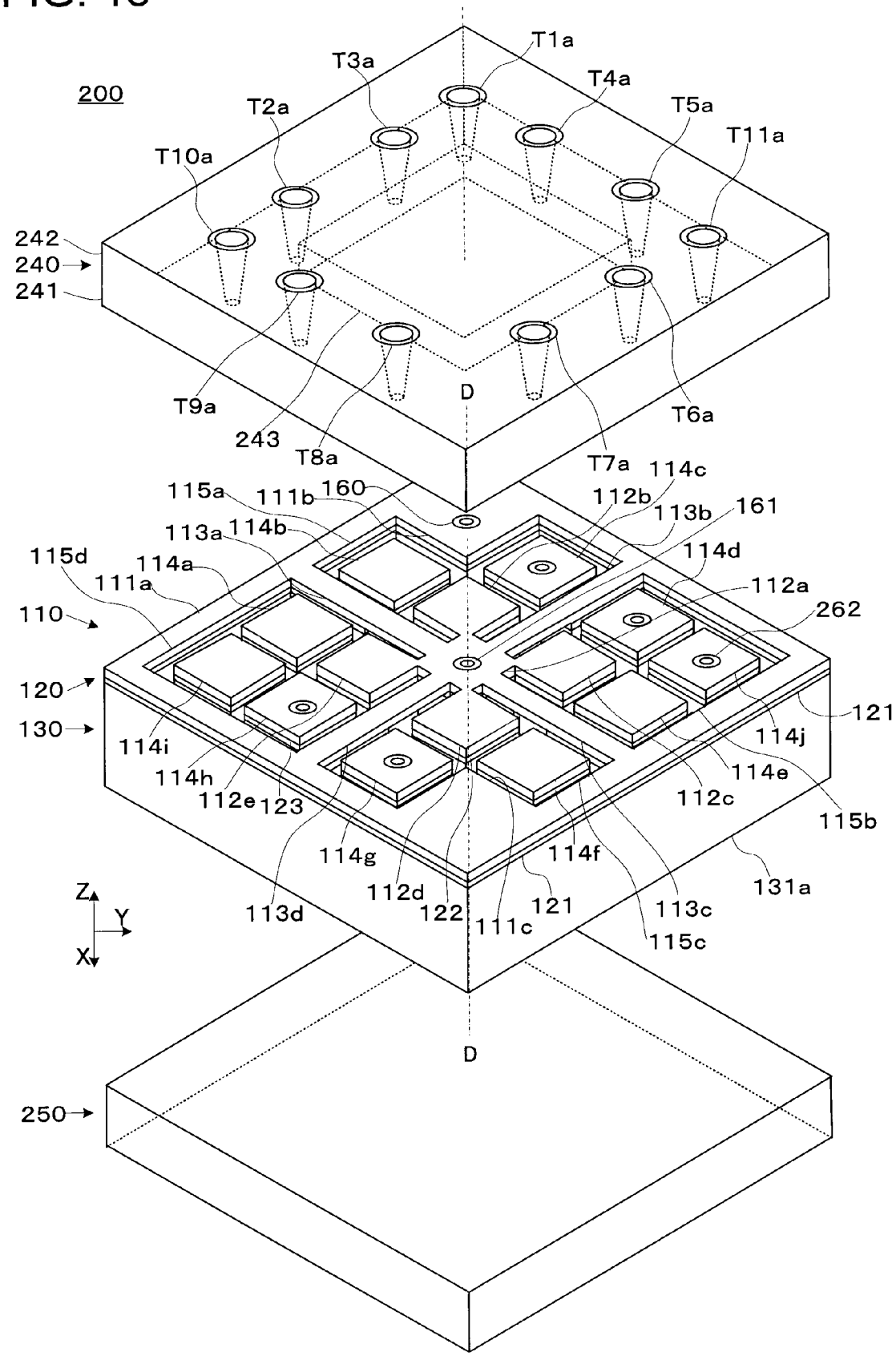
FIG. 18 is an exploded perspective view showing a state that a mechanical quantity sensor according to a second embodiment of the present invention is disassembled.
Figure 19:
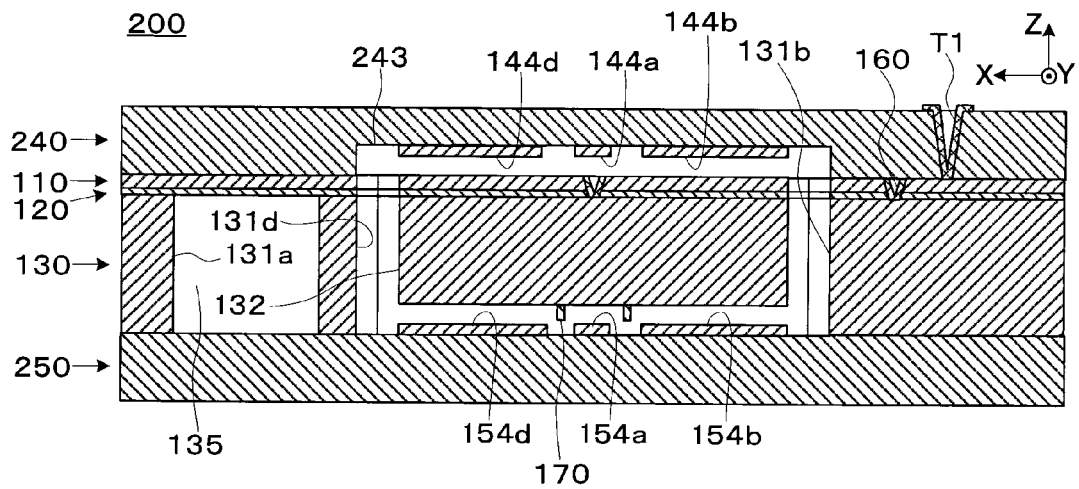
FIG. 19 is a cross-sectional view taken along a line D-D in FIG. 18.

FIG. 18 is an exploded perspective view showing a state that a mechanical quantity sensor 200 according to a second embodiment of the present invention is disassembled. FIG. 19 is a cross-sectional view taken along a line D-D in FIG. 18. Parts common to FIG. 1 and FIG. 11 are given the same reference numerals, and overlapping descriptions are omitted.

As shown in FIG. 18 and FIG. 19, the mechanical quantity sensor 200 of this embodiment is different from the mechanical quantity sensor 100 of the first embodiment in the following points.

First, in the mechanical quantity sensor 200 of this embodiment, wiring terminals T1a to T11a are formed in a first base 240 instead of the wiring terminals T1 to T11 formed in the second base 150 of the mechanical quantity sensor 100 in the first embodiment.

Secondly, in the mechanical quantity sensor 200 of this embodiment, the conduction portions 262 are provided in the block upper layer portions 114c, 114d, 114g, 114h, 114j instead of the conduction portions 162 formed in the block upper layer portions 114a, 114b, 114e, 114f, 114i of the mechanical quantity sensor 100 in the first embodiment.

The conduction portions 262 establish conduction between the block upper layer portions 114c, 114d, 114g, 114h, 114j and the block lower layer portions 134c, 134d, 134g, 134h, 134j respectively, and penetrate the block upper layer portions 114c, 114d, 114g, 114h, 114j and the joining part 123 respectively. The structures of the conduction portions 262 are the same as those of the conduction portions 160 to 162 in the first embodiment.

The first base 240 is formed of, for example, a glass material, has a substantially parallelepiped outer shape, and has a frame portion 241 and a bottom plate portion 242. The frame portion 241 and the bottom plate portion 242 can be made by forming a recessed portion 243 in a substantially rectangular parallelepiped shape (for example, 2.5 mm square and 5 μm deep) in a substrate.

In the first base 240, the wiring terminals Ta (T1a to T11a) are provided penetrating the frame portion 241 and the bottom plate portion 242, allowing electrical connections from the outside of the mechanical quantity sensor 200 to the driving electrodes 144a, 154a and the detection electrodes 144b to 144e, 154b to 154e. The structures of the wiring terminals T1a to T11a are the same as those of the wiring terminals T1 to T11 in the first embodiment.

A lower end of the wiring terminal T1a is connected to an upper face of the projecting portion 111b of the fixed portion 111. Lower ends of the wiring terminals T2a to T9a are connected to upper faces of the block upper layer portions 114a to 114h, respectively (the numerical order of T2a to T9a of the wiring terminals T2a to T9a corresponds to the alphabetical order of 114a to 114h of the block upper layer portions 114a to 114h, respectively). The wiring terminals T10a, T11a are connected to upper faces of the block upper layer portions 114i, 114j, respectively.

Therefore, similarly to the wiring terminals T2 to T11 in the first embodiment, the wiring terminals T2a to T11a are connected electrically to the detection electrodes 144e, 144b, 154b, 154c, 144c, 144d, 154d, 154e, and the driving electrodes 144a, 154a, in order respectively.

Further, similarly to the wiring terminal T1 in the first embodiment, the wiring terminal T1a is connected electrically to the electrodes E1 formed in the upper face of the displaceable portion 112 and the lower face of the weight portion 132.

As a result of movement of cations from the second base 250 due to the anodic bonding of the second base 250, a negative space-charge layer is formed in the vicinity of the surface on the side close to the weight portion 132 of the second base 250. In this embodiment, when the second base 250 is anodically bonded, the driving electrode 154a and the detection electrodes 154b to 154e are connected electrically to external grounds (grounded) via the wiring terminals T11a, T4a, T5a, T8a, T9a connected electrically to the driving electrode 154a and the detection electrodes 154b to 154e, respectively. These grounded driving electrode 154a and detection electrodes 154b to 154e cover the negative space-charge layer formed in the vicinity of the surface of the second base 250, and thus function as a shield layer which blocks an electrostatic force. Accordingly, when the second base 250 is anodically bonded, electrostatic attraction working on the lower face of the weight portion 132 and the upper face of the second base 250 can be reduced, and thus it is possible to suppress adherence of the weight portion 132 and the projections 170 to the second base 250.

Further, the projections 170 are provided in the areas corresponding to areas on the rear face of the weight portion 132 where the driving electrode 154a and the detection electrodes 154b to 154e are not arranged. Accordingly, as described above, it is possible to suppress adherence of the weight portion 132 and the projections 170 to the second base 150 even when the weight portion 132 is attracted to the second base 150 by electrostatic attraction when the second base 150 and the second structure 130 are anodically bonded.

In addition, instead of the projections 170 with entire bodies or tips being formed of, for example, metal such as Au, Pt, or the like which is difficult to be oxidized, it is possible to provide projections 170a formed of an insulating material such as a silicon oxide, a silicon nitride, or the like.

As described above, with the mechanical quantity sensor 200 and the method of manufacturing the same, the driving electrode 154a and the detection electrodes 154b to 154e can be made to function as a shield layer when the second base 250 is anodically bonded, and moreover, the projections 170 provided on the rear face of the weight portion 132 can be made to function as joining preventing parts. Accordingly, with the mechanical quantity sensor 200 and the method of manufacturing the same, it is possible to more reliably suppress adhesion of the weight portion 132 and the projections 170 to the second base 250 when the second base 250 is anodically bonded.

Further, in this embodiment, when the second base 250 is anodically bonded, the driving electrode 144a and the detection electrodes 144b to 144e are connected electrically to external grounds (grounded) via the wiring terminals T10a, T3a, T6a, T7a, T2a connected electrically to the driving electrode 144a and the detection electrodes 144b to 144e, respectively. Accordingly, even when a negative space-charge layer is formed in the vicinity of the surface of the first base 240, the driving electrode 144a and the detection electrodes 144b to 144e cover the surface of the first base 240, and thus function as a shield layer which blocks an electrostatic force. Accordingly, when the second base 250 is anodically bonded, electrostatic attraction working on the upper face of the displaceable portion 112 and the lower face of the first base 240 can be reduced, and thus it is possible to further suppress adhesion of the displaceable portion 112 to the first base 240.

Moreover, in this embodiment, when the semiconductor substrate W and the second base 250 are anodically bonded, the wiring terminal T1a electrically connected to the weight portion 132 and the wiring terminals T2a to T11a electrically connected to the driving electrodes 144a, 154a and the detection electrodes 144b to 144e, 154b to 154e are connected electrically on the outside via conducting wires or the like.

Thus, when the second base 250 is anodically bonded, electrical conduction is established between the driving electrode 154a and the detection electrodes 154b to 154e arranged on the upper face of the second base 250 and the lower face of the weight portion 132, and they have equal potentials. No electrostatic attraction works between the driving electrode 154a and the detection electrodes 154b to 154e and the lower face of the weight portion 132, which have equal potentials. Thus, in the mechanical quantity sensor 200 and the method of manufacturing the same, adhesion of the weight portion 132 and the projections 170 to the second base 250 can further be suppressed when the second base 250 is anodically bonded.

Further, when the second base 250 is anodically bonded, the driving electrode 144a and the detection electrodes 144b to 144e arranged on the upper face of the first base 240 and the upper face of the displaceable portion 112 are electrically connected on the outside via conducting wires or the like. Thus, electrical conduction is established between the driving electrode 144a and the detection electrodes 144b to 144e and the upper face of the displaceable portion 112, and thus they have equal potentials. No electrostatic attraction works between the driving electrode 144a and the detection electrodes 144b to 144e and the upper face of the displaceable portion 112, which have equal potentials. Thus, in the mechanical quantity sensor 200 and the method of manufacturing the same, adhesion of the displaceable portion 112 to the first base 240 can further be suppressed when the second base 250 is anodically bonded.

Steps of making the mechanical quantity sensor 200 will be described.

Figure 20:
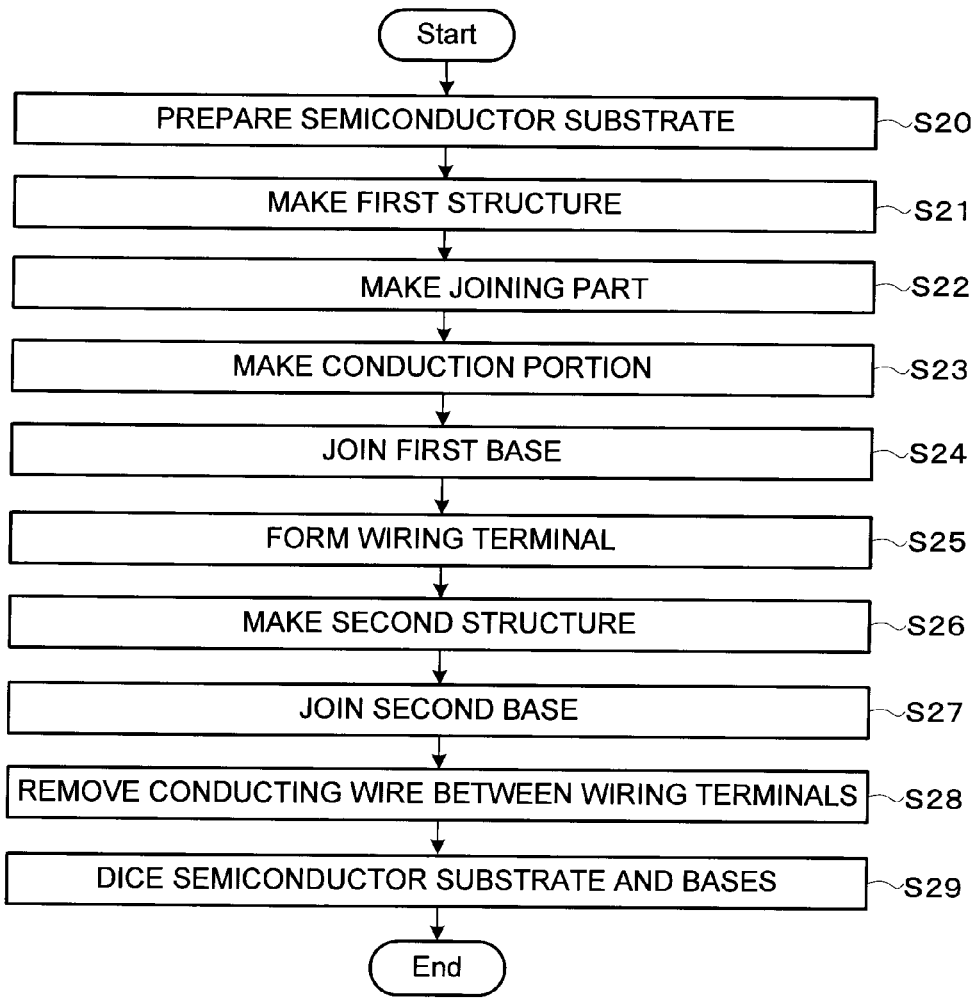
FIG. 20 is a flowchart showing an example of a making procedure of the mechanical quantity sensor according to the second embodiment of the present invention.

FIG. 20 is a flowchart showing an example of a making procedure of the mechanical quantity sensor 200.

The method of making the mechanical quantity sensor 200 of this embodiment is different from the method of making the mechanical quantity sensor 100 of the first embodiment in the following points.

First, in this embodiment, the wiring terminals T1a to T11a are formed in the second base 240 in step 25, instead of forming the wiring terminals T1 to T11 on the second base 150 in step 17 in the method of making the mechanical quantity sensor 100 in the first embodiment.

Secondly, in this embodiment, in bonding of the second base 250 in step 47, the wiring terminals T2a to T11a electrically connected to the driving electrodes 144a, 154a and the detection electrodes 144b to 144e, 154b to 154e are connected electrically to external grounds (grounded).

Thirdly, in this embodiment, in bonding of the second base 250 in step 47, the wiring terminal T1a connected electrically to the weight portion 132 and the wiring terminals T2a to T11a connected electrically to the driving electrodes 144a, 154a and the detection electrodes 144b to 144e, 154b to 154e are electrically connected on the outside via conducting wires or the like.

Thirdly, in step 28, the conducting wires for example which connect the wiring terminal T1a and the wiring terminals T2a to T11a on the outside of the mechanical quantity sensor 200 are removed.

Modification Example

Note that in this embodiment, the driving electrode 154a and the detection electrodes 154b to 154e are grounded and made to function as a shield layer when the second base 250 is anodically bonded. Further, the projections 170 are provided and made to function as joining preventing parts in the areas corresponding to areas on the rear face of the weight portion 132 where the driving electrode 154a and the detection electrodes 154b to 154e are not arranged.

On the other hand, instead of providing the projections 170, the areas of the driving electrode 154a and the detection electrodes 154b to 154e which function as a shield layer may be made larger than in the second embodiment, so as to make a smaller sum total of areas of gaps of the driving electrode 154a and the detection electrodes 154b to 154e as a result. By having the smaller sum total of the areas of gaps of the driving electrode 154a and the detection electrodes 154b to 154e, the electrostatic attraction working between the weight portion 132 and the second base 250 can be made smaller when the second base 250 is anodically bonded, and thus it is possible to suppress adhesion of the weight portion 132 to the second base 250.

Other Embodiments

Embodiments of the present invention are not limited to the above-described embodiments and can be extended and modified. Extended and modified embodiments are included in the technical scope of the present invention.

For example, the mechanical quantity sensors 100, 200 are described with examples of using a conductive material (silicon containing impurities) for the first structure 110 and the second structure 130 (except the projections 170), but it is not always necessary that the entire body is formed of the conductive material. It may be arranged that at least necessary parts, such as the driving electrodes E1, the detection electrodes E1, parts establishing conduction between the wiring terminal T10 and the upper face of the block upper layer portion 114i, and the like, are formed of the conductive material.

What is claimed is:

1. A method of manufacturing a mechanical quantity sensor, comprising:
    forming a first structure having a fixed portion with an opening, a displaceable portion arranged in the opening and displaceable relative to the fixed portion, and a connection portion connecting the fixed portion and the displaceable portion, by etching a first layer of a semiconductor substrate formed by sequentially stacking the first layer formed of a first semiconductor material, a second layer formed of an insulating material, and a third layer formed of a second semiconductor material;
    arranging and stacking a first base formed of an insulating material on the first structure by joining the first base to the fixed portion;
    forming a second structure having a weight portion joined to the displaceable portion, a projection arranged on a face of the weight portion on a side opposite to a face joined to the displaceable portion or on a face of an area of the third layer where the weight portion is to be formed on a side opposite to a face joined to the displaceable portion, and a pedestal arranged surrounding the weight portion and joined to the fixed portion, by etching the third layer; and
    arranging and stacking a second base on the second structure by anodically bonding the second base to the pedestal while the first driving electrode and the first detection electrode are grounded, the second base formed of an insulating material and having a first driving electrode arranged on a face facing the weight portion, formed of a conductive material, and applying vibration in a stacking direction to the displaceable portion, and a first detection electrode arranged on a face facing the weight portion, formed of a conductive material, and detecting a displacement of the displaceable portion,
    wherein the projection is arranged in an area corresponding to an area where the first driving electrode and the first detection electrode are not arranged, and has a thickness larger than thicknesses of the first driving electrode and the first detection electrode.

2. The method of manufacturing the mechanical quantity sensor according to claim 1, wherein a tip of the projection is formed of at least one selected from gold and platinum.

3. The method of manufacturing the mechanical quantity sensor according to claim 1, wherein the projection is formed of at least one selected from a silicon oxide and a silicon nitride.

4. The method of manufacturing the mechanical quantity sensor according to claim 1, further comprising:
    forming a first conduction portion electrically connecting the fixed portion and the third layer between the forming the first structure and the arranging and stacking the first base on the first structure; and
    forming a second conduction portion electrically connecting the displaceable portion and the third layer,
    wherein the arranging and stacking the second base on the second structure is performed while conduction is established between the first driving electrode and the first detection electrode and the pedestal.

5. The method of manufacturing the mechanical quantity sensor according to claim 1,
    wherein the first base has a second driving electrode applying vibration in a stacking direction to the displaceable portion, arranged on a face facing the displaceable portion, and formed of a conductive material, and a second detection electrode detecting a displacement of the displaceable portion, arranged on a face facing the displaceable portion, and formed of a conductive material; and
    wherein the arranging and stacking the second base on the second structure is performed while the second driving electrode and the second detection electrode are grounded.

6. The method of manufacturing the mechanical quantity sensor according to claim 1, wherein the arranging and stacking the second base on the second structure is performed while conduction is established between the second driving electrode and the second detection electrode and the fixed portion.

* * * * *